United States Patent
Konstantatos et al.

(10) Patent No.: US 12,344,783 B2
(45) Date of Patent: *Jul. 1, 2025

(54) METHODS FOR OBTAINING AN N-TYPE DOPED METAL CHALCOGENIDE QUANTUM DOT SOLID-STATE ELEMENT WITH OPTICAL GAIN AND A LIGHT EMITTER INCLUDING THE ELEMENT, AND THE OBTAINED ELEMENT AND LIGHT EMITTER

(71) Applicants: FUNDACIÓ INSTITUT DE CIENCIES FOTONIQUES, Castelldefels (ES); INSTITUCIÓ CATALANA DE RECERCA I ESTUDIS AVANÇATS, Barcelona (ES)

(72) Inventors: Gerasimos Konstantatos, Castelldefels (ES); Sotirios Christodoulou, Castelldefels (ES)

(73) Assignees: FUNDACIÓ INSTITUT DE CIÈNCIES FOTÒNIQUES, Castelldefels (ES); INSTITUCIÓ CATALANA DE RECERCA I ESTUDIS AVANATS, Barcelona (ES)

( * ) Notice: Subject to any disclaimer, the term of this patent is extended or adjusted under 35 U.S.C. 154(b) by 859 days.

This patent is subject to a terminal disclaimer.

(21) Appl. No.: 17/613,851

(22) PCT Filed: May 25, 2020

(86) PCT No.: PCT/EP2020/064443
§ 371 (c)(1),
(2) Date: Nov. 23, 2021

(87) PCT Pub. No.: WO2020/234485
PCT Pub. Date: Nov. 26, 2020

(65) Prior Publication Data
US 2022/0235263 A1   Jul. 28, 2022

(30) Foreign Application Priority Data

May 23, 2019 (EP) .................................. 19382418

(51) Int. Cl.
*H01S 5/34* (2006.01)
*C01G 21/21* (2006.01)
(Continued)

(52) U.S. Cl.
CPC .......... *C09K 11/661* (2013.01); *C01G 21/21* (2013.01); *H01S 5/1075* (2013.01);
(Continued)

(58) Field of Classification Search
CPC .... H01S 5/3022; H01S 5/3222; H01S 5/3426; H01S 5/347; C09K 11/664; C09K 11/661
See application file for complete search history.

(56) References Cited

U.S. PATENT DOCUMENTS 10,937,930 B2 * 3/2021 Konstantatos ............ G01J 3/10
11,276,792 B2 * 3/2022 Konstantatos ...... H01L 31/0296
(Continued)

OTHER PUBLICATIONS

International Search Report corresponding to International Patent Application No. PCT/EP2020/064443 dated Sep. 2, 2020.
(Continued)

*Primary Examiner* — Xinning(Tom) Niu
*Assistant Examiner* — Delma R Forde
(74) *Attorney, Agent, or Firm* — Jenkins, Taylor & Hunt, P.A.

(57) ABSTRACT

The present invention relates to a method for obtaining an n-type doped metal chalcogenide quantum dot solid-state element with optical gain for low-threshold, band-edge amplified spontaneous emission (ASE), comprising: —forming a metal chalcogenide quantum dot solid-state element, and —carrying out an n-doping process on its metal chalcogenide quantum dots to at least partially bleach its
(Continued)

band-edge absorption, which comprises: —a partial substitution of chalcogen atoms by halogen atoms, in the metal chalcogenide quantum dots, and/or —a partial aliovalent-cation substitution of bivalent metal cations by trivalent cations, in the metal chalcogenide quantum dots; and —providing a substance on the metal chalcogenide quantum dots, to avoid oxygen p-doping. The present invention also relates to the obtained n-type doped metal chalcogenide quantum dot solid-state element, a method for obtaining a light emitter with that n-type doped metal chalcogenide quantum dot solid-state element, and the obtained light emitter.

18 Claims, 13 Drawing Sheets

(51) Int. Cl.
| | | |
|---|---|---|
| *C09K 11/66* | (2006.01) | |
| *H01S 5/10* | (2021.01) | |
| *H01S 5/12* | (2021.01) | |
| *H01S 5/183* | (2006.01) | |
| *H01S 5/347* | (2006.01) | |
| *B82Y 20/00* | (2011.01) | |
| *B82Y 40/00* | (2011.01) | |

(52) U.S. Cl.
CPC .............. *H01S 5/1078* (2013.01); *H01S 5/12* (2013.01); *H01S 5/18327* (2013.01); *H01S 5/347* (2013.01); *B82Y 20/00* (2013.01); *B82Y 40/00* (2013.01); *C01P 2004/64* (2013.01); *C01P 2006/60* (2013.01)

(56) References Cited

U.S. PATENT DOCUMENTS

2016/0380136 A1   12/2016   Ning et al.
2018/0216003 A1   8/2018   Zhang et al.

OTHER PUBLICATIONS

Written Opinion of the International Searching Authority corresponding to International Patent Application No. PCT/EP2020/064443 dated Sep. 2, 2020.
Zhang et al. (2014) "Diffusion-Controlled Synthesis of PbS and PbSe Quantum Dots with In Situ Halide Passivation for Quantum Dot Solar Cells," ACS Nano, vol. 8, No. 1, pp. 614-622.

* cited by examiner

1st Order DFB

Mixed DFB 1st Order and 2nd Order

METHODS FOR OBTAINING AN N-TYPE DOPED METAL CHALCOGENIDE QUANTUM DOT SOLID-STATE ELEMENT WITH OPTICAL GAIN AND A LIGHT EMITTER INCLUDING THE ELEMENT, AND THE OBTAINED ELEMENT AND LIGHT EMITTER

CROSS-REFERENCE TO RELATED APPLICATIONS

This application is a United States National Stage entry of PCT International Patent Application Publication No. PCT/EP2020/064443, filed May 25, 2020, which itself claims benefit of European Application Serial No. EP 19382418.2, filed on May 23, 2019, the disclosure of each of which is incorporated herein by reference in its entirety.

The project leading to this application has received funding from the European Research Council (ERC) under the European Union's Horizon 2020 research and innovation programme (grant agreement No 725165).

FIELD OF THE INVENTION

The present invention relates, in a first aspect, to a method for obtaining an n-type doped metal chalcogenide quantum dot solid-state element with optical gain for low-threshold, band-edge amplified spontaneous emission (ASE), comprising a robust n-doping process to bleach its band-edge absorption.

A second aspect of the present invention relates to an n-type doped metal chalcogenide quantum dot solid-state element with optical gain for low-threshold, band-edge amplified spontaneous emission (ASE).

A third aspect of the present invention concerns to a method for obtaining a light emitter comprising the provision of a gain medium comprising the n-type doped metal chalcogenide quantum dot solid-state element obtained with the method of the first aspect of the present invention.

A fourth aspect of the present invention relates to a light emitter, comprising an n-type doped metal chalcogenide quantum dot solid-state element with optical gain for low-threshold, band-edge amplified spontaneous emission (ASE) and an optical or electrical pump

BACKGROUND OF THE INVENTION

Materials with optical gain in the infrared are of paramount importance for optical communications, medical diagnostics [1] and silicon photonics [2,3]. The current technology is based either on costly III-V semiconductors that are not monolithic to silicon CMOS technology and Er-doped fibre technology that does not make use of the full fibre transparency window. Colloidal quantum dots (CQD) offer a unique opportunity as an optical gain medium[4] in view of their tuneable bandgap, solution processability and CMOS compatibility. Their potential for narrower linewidths [5] and the lower-than-bulk degeneracy [6] has led to dramatic progress towards successful demonstration of optical gain [4], stimulated emission [7] and lasing [8,9,10] in the visible part of spectrum utilizing CdSe-based CQDs. Infrared colloidal quantum dots however exhibit higher state degeneracy and as a result band-edge stimulated emission has imposed very high thresholds [11,12].

Low threshold, band-edge amplified spontaneous emission (ASE) in CQDs has been at the centre of intensive research over recent years as a prerequisite towards the demonstration of CQD lasing [10,13]. Engineered CQDs with suppressed Auger [7] and photodoping [14] have allowed the realization of low threshold ASE at the single exciton regime, in the visible, for CdSe CQD systems that possess a two-fold degeneracy value. Nevertheless, low-threshold band-edge ASE in the near-infrared (NIR), based on colloidal quantum dots, has remained a challenge due to the high degeneracy of Pb-chalcogenide CQDs. PbS CQDs is the material of choice for solution processed infrared optoelectronics with successful demonstrations in LEDs [15], solar cells [16,17] and photodetectors [18,19]. The 8-fold degeneracy of PbS CQDs, however, has hindered the demonstration of CQD low-threshold optical gain and ASE, at room temperature, in the infrared across the telecommunications wavelength bands [11,12,20].

It is, therefore, necessary to provide an alternative to the state of the art which covers the gaps found therein, by providing a method for obtaining an n-type doped metal chalcogenide quantum dot solid-state element with optical gain for low-threshold, band-edge amplified spontaneous emission (ASE), even in the near-infrared, and a light emitter including the element.

SUMMARY OF THE INVENTION

To that end, the present invention relates to a method for obtaining an n-type doped metal chalcogenide quantum dot solid-state element with optical gain for low-threshold, band-edge amplified spontaneous emission (ASE), comprising:

forming a metal chalcogenide quantum dot solid-state element, and carrying out an n-doping process on at least a plurality of the metal chalcogenide quantum dots of said metal chalcogenide quantum dot solid-state element, to at least partially bleach its band-edge absorption, wherein said n-doping process comprises:

a partial substitution of chalcogen atoms by halogen atoms, in at least said plurality of metal chalcogenide quantum dots, and/or;

a partial aliovalent-cation substitution of bivalent metal cations by trivalent cations, in at least said plurality of metal chalcogenide quantum dots;

and providing a substance on at least said plurality of metal chalcogenide quantum dots, wherein said substance is made and arranged to avoid oxygen p-doping of the plurality of metal chalcogenide quantum dots.

Generally, the n-type doped metal chalcogenide quantum dot solid-state element is obtained as a film, according to the method of the first aspect of the present invention, although, for other embodiments, the n-type doped metal chalcogenide quantum dot solid-state element is not obtained as a film but as a different element (differing at least regarding its shape), such as a solid or hollow part, for example a prismatic or cylinder solid or hollow part, in order to be adapted to the intended application/device.

For an embodiment, the metal chalcogenide is at least one of Pb-, Cd-, and Hg-chalcogenide, wherein the chalcogen atoms are at least one of sulphur, selenium, and tellurium atoms, and wherein said halogen atoms are at least one of iodine, bromine, and chlorine atoms.

In other words, the metal chalcogenide is represented by MX in which M can be Pb, Cd, Hg and X can be S, Se, Te, or combinations thereof.

Preferably the crystal structure of the metal chalcogenide quantum dots is of zinc blende or rock salt structure.

Also preferably, in the metal chalcogenide, the metal has a +2 oxidation state and the chalcogen has a −2 oxidation state.

For an implementation of said embodiment, the method comprises submitting the metal chalcogenide quantum dot solid-state element to a ligand exchange treatment based on halide salts, for example $ZnI_2$, $PbI_2$, $CdI_2$, TBAI, EMII, TMAI and corresponding salts of bromides and chlorides, or mixtures of halides salts and thiols (where thiols can be any of alkylthiols, di-thiols, mercapto acids), for example $ZnI_2$/MPA.

According to an embodiment, the metal chalcogenide is at least one of Pb-, Cd-, and Hg-chalcogenide, wherein said bivalent metal cations are at least one of Pb, Cd, and Hg, in the +2 oxidation state, and wherein said trivalent cations are at least one of In, Bi, Sb, and Ga, in the +3 oxidation state.

According to an embodiment, the method of the first aspect of the present invention comprises providing the above mentioned substance to coat the metal chalcogenide quantum dot solid-state element to isolate the same from ambient oxygen.

For a complementary or alternative embodiment, the method of the first aspect of the present invention comprises providing the above mentioned substance to infiltrate within the metal chalcogenide quantum dot solid-state element to react with oxygen present therein for suppressing their p-doping effect.

For a preferred embodiment, the method of the first aspect of the present invention comprises providing the above mentioned substance by atomic layer deposition (ALD), although other less preferred deposition techniques are also embraced by the method of the present invention for providing that substance, such as chemical bath deposition or chemical layer deposition.

The above mentioned substance is an oxide-type substance.

For some embodiments, the above mentioned substance is at least one of alumina, titania, ZnO, and hafnia.

For an embodiment of the method of the first aspect of the present invention, the step of forming the metal chalcogenide quantum dot solid-state element comprises forming a solid state element with only one type of quantum dots, having exposed chalcogen facets to allow halide doping and therefore allow n-type doping. In the case of PbS this happens typically for quantum dots with a bandgap of around 1200 nm corresponding to diameter of approximately 4 nm. For this embodiment, the method comprises applying the above mentioned n-doping process on the whole formed solid state element such that all the metal chalcogenide quantum dots are heavily n-doped.

For a complementary or alternative embodiment of the method of the first aspect of the present invention, the step of forming the metal chalcogenide quantum dot solid-state element comprises forming a solid state element with only one type of quantum dots, wherein the n-doping of said quantum dots is carried out at least during the synthesis thereof by one or both of the above mentioned n-doping mechanisms, i.e. by means of a partial aliovalent-cation substitution of bivalent metal cations by trivalent cations and/or by means of a partial substitution of chalcogen atoms by halogen atoms, in at least the core of the metal chalcogenide quantum dots, by introducing trivalent cations and/or halides in situ during the reaction and growth of the metal chalcogenide quantum dots.

For another embodiment, the step of forming the metal chalcogenide quantum dot solid-state element comprises forming a blend with a host matrix of first metal chalcogenide quantum dots and, embedded therein, the plurality of metal chalcogenide quantum dots, which are second metal chalcogenide quantum dots having a smaller or equal bandgap, wherein the second metal chalcogenide quantum dots are larger than the first metal chalcogenide quantum dots, and wherein the method comprises applying said n-doping process at least on the second metal chalcogenide quantum dots so that they are heavily n-doped.

For an implementation of said embodiment, for which the n-doping process includes at least the above mentioned partial substitution of chalcogen atoms by halogen atoms, the second metal chalcogenide quantum dots are larger and have a different morphology than the first metal chalcogenide quantum dots so that the second metal chalcogenide quantum dots possess more exposed facets containing chalcogen atoms, and the method comprises applying the n-doping process on the whole formed metal chalcogenide quantum dot solid-state element such that the second metal chalcogenide quantum dots are heavily n-doped (because they possess the appropriate planes to allow doping) while the first metal chalcogenide quantum dots are not n-doped (i.e. undoped) or only slightly n-doped.

According to a variant of said implementation, the method of the first aspect of the present invention comprises selecting the size and morphology of the first metal chalcogenide quantum dots such that they do not possess any chalcogen-containing exposed facet, and selecting the size and morphology of the second metal chalcogenide quantum dots such that they do possess at least one chalcogen-containing exposed facets.

For a complementary or alternative implementation of said embodiment, for which the n-doping process includes one or both of the above mentioned n-doping mechanisms, i.e. by means of a partial aliovalent-cation substitution of bivalent metal cations by trivalent cations and/or by means of a partial substitution of chalcogen atoms by halogen atoms, the method comprises carrying out the n-doping process during the synthesis of the second metal chalcogenide quantum dots, in at least the core of the metal chalcogenide quantum dots, by introducing trivalent cations and/or halides in situ during the reaction and growth of the metal chalcogenide quantum dots, and then mixing the already heavily n-doped second metal chalcogenide quantum dots with the first metal chalcogenide quantum dots to form said blend. In addition, optionally, a post-synthetic n-doping process can be applied over the already formed blend, as described above, i.e. by applying the n-doping process consisting in the partial substitution of chalcogen atoms by halogen atoms on the whole formed metal chalcogenide quantum dot solid-state element such that the second metal chalcogenide quantum dots are heavily n-doped (because they possess the appropriate planes to allow doping) while the first metal chalcogenide quantum dots are not n-doped or only slightly n-doped.

Therefore, depending on the embodiment, the n-doping process included in the method of the present invention is applied during the synthesis of the metal chalcogenide quantum dots and/or post-synthetically.

The method of the first aspect of the present invention comprises forming said blend with a concentration of second metal chalcogenide quantum dots preferably ranging from 1% up to 50% by volume, and even more preferably between 5% and 25% by volume.

For some embodiments, regarding the metal chalcogenide quantum dots which are or are to be heavily n-doped, their size ranges from 2 nm to 30 nm in diameter, their bandgaps ranges from 2.5 eV down to 0.2 eV, and their thickness ranges from 20 nm to 10 µm, preferably between 100 nm and 1 µm.

For some embodiments, the method of the first aspect of the present invention comprises selecting the size of the plurality of metal chalcogenide quantum dots to obtain, after the n-doping process has been carried out thereon, an initial electron occupancy doping $<N>_D$ ranging from 1.4 to 5.4.

For an embodiment, the plurality of metal chalcogenide quantum dots are of a core-only type, while for another embodiment at least part of the plurality of metal chalcogenide quantum dots are of a core-shell type, each including a core and one or several shells, wherein said core comprises a metal chalcogenide and said shell a distinct metal chalcogenide or an alloy of the metal chalcogenide of the core, and wherein the n-doping process is applied to either the core, the at least one shell, or both.

For the core-only type metal chalcogenide quantum dots, the n-doping process can be applied during the synthesis of the metal chalcogenide quantum dots and/or post-synthetically, as explained above.

For the core-shell type metal chalcogenide quantum dots, for some embodiments the n-doping process is applied during the synthesis of the metal chalcogenide quantum dots (especially if the n-doping takes place directly in the core), while for other embodiments, the n-doping process, only for the chalcogen n-doping mechanism, is applied also or only post-synthetically, as explained above, although in this latter case the n-doping takes place in the shell(s) and, due to the band alignment of the core with the shell(s) that allows delocalization of electrons, the dopant electrons are transferred to the core.

The reason behind the provision and n-doping of the core-shell type metal chalcogenide quantum dots is to delocalize the electrons across the core-shell structure whereas the hole remains in the core so that Auger recombination can be suppressed. Due to the formation of quasi-type I heterostructures when the shell is n-doped, electrons are delocalized across the core and shell and therefore doping of the core and/or of the shell becomes effective, i.e. becomes possible.

The shell may comprise any of the semiconductors of the above mentioned metal chalcogenides (but distinct to the metal chalcogenide making the core, or an alloy of that metal chalcogenide), i.e. for which the metal chalcogenide is at least one of Pb-, Cd-, and Hg-chalcogenide, and also may comprise a Zn-chalcogenide, and the chalcogen atoms are at least one of S, Se, and Te, or combinations thereof.

Alloys of the shell can be formed, for example, by the combination of S and Se as the chalcogens of the shell and/or the combination of two different metals, for example Pb and Cd, Zn and Pb, etc.

For example, the core can be made of PbS and the shell of PbSSe, or the core made of PbS and the shell of PbCdS.

The shell may comprise different layers, for example a shell can be made of layers of CdS, ZnS, etc. or of a different alloy.

The core can be of diameter ranging from 1 nm to 20 nm and the shell around this can have a thickness ranging from 0.5 nm to 50 nm. The shell can be further implement by a gradual change of the alloy in gradually shifting the energy levels and increasing the bandgap of the shell so as to provide strong confinement for the holes and weak confinement (if any confinement) to the electrons.

A second aspect of the present invention concerns to an n-type doped metal chalcogenide quantum dot solid-state element with optical gain for low-threshold, band-edge amplified spontaneous emission (ASE), comprising a plurality of metal chalcogenide quantum dots with its band-edge absorption at least partially bleached, wherein said plurality of metal chalcogenide quantum dots comprises:
  some chalcogen atoms substituted by halogen atoms, and/or
  some bivalent metal cations aliovalent-cation substituted by trivalent cations;
and wherein a substance is provided on at least said plurality of metal chalcogenide quantum dots, wherein said substance is made and arranged to avoid oxygen p-doping of the plurality of metal chalcogenide quantum dots.

For an embodiment, the n-type doped metal chalcogenide quantum dot solid-state element of the second aspect of the present invention is obtainable by means of the method of the first aspect of the present invention.

Generally, the n-type doped metal chalcogenide quantum dot solid-state element of the second aspect of the present invention is a film, although, for other embodiments, the n-type doped metal chalcogenide quantum dot solid-state element is not a film but a different element (differing at least regarding its shape), such as a solid or hollow part, for example a prismatic or cylinder solid or hollow part, in order to be adapted to the intended application/device.

In a third aspect, the present invention relates to a method for obtaining a light emitter, comprising:
  providing a gain medium comprising at least one n-type doped metal chalcogenide quantum dot solid-state element obtained according to the method of the first aspect of the present invention, for any of its embodiments; and
  providing an optical or electrical pump configured and arranged to excite the at least one n-type doped metal chalcogenide quantum dot solid-state element so that a population inversion is produced therein that generates an amplified spontaneous emission (ASE).

A fourth aspect of the present invention relates to a light emitter, comprising:
  a gain medium comprising at least one n-type doped metal chalcogenide quantum dot solid-state element obtained according to the method of the first aspect of the invention; and
  an optical or electrical pump configured and arranged to excite said at least one n-type doped metal chalcogenide quantum dot solid-state element so that a population inversion is produced therein that generates an amplified spontaneous emission (ASE).

For an embodiment, the light emitter of the fourth aspect of the present invention is obtainable by means of the method of the third aspect of the present invention.

Preferably, the light emitter of the fourth aspect of the present invention is configured to emit light with a wavelength ranging from 800 nm to 2400 nm, although other wavelength ranges are also covered by the present invention.

For an embodiment of the fourth aspect of the present invention, the light emitter is a superluminescence light emitter.

For another embodiment of the fourth aspect of the present invention, the light emitter is a laser device which further comprises a laser optical cavity and, optically coupled thereto, the above mentioned gain medium, which is a laser gain medium, wherein said laser optical cavity is configured and arranged to provide optical feedback to the amplified spontaneous emission (ASE).

Different implementations for said laser device are covered by the present invention, including those comprising at least one of a vertical-cavity surface-emitting laser structure (VCSEL), a distributed feedback laser structure (DFB), a whispering gallery mode laser structure (WGM), or a combination thereof.

For a variant of one of said implementations, the VCSEL structure comprises the above mentioned laser gain medium, generally in the form of a film with a thickness ranging from 200 nm to 1 μm, sandwiched between two Bragg reflectors forming a photonic bandgap ranging from 1000 nm to 2000 nm.

For another variant of one of said implementations, the DFB structure comprises a waveguide resonator formed by:
a corrugated substrate with corrugations implemented by periodically arranged structured elements forming a grating with a grating height ranging from 20 nm to 500 nm, and a periodicity (Λ) ranging from 700 nm to 1400 nm, and
the laser gain medium, with a thickness ranging from 20 nm to 1500 nm, arranged on top of said corrugated substrate over said corrugations.

For another variant of one of said implementations, the WGM structure comprises said laser gain medium with a thickness ranging from 10 nm to 2000 nm, optically coupled to one or more WGM resonators for single or multi laser mode, wherein the diameter of each resonator ranges from 50 μm to 1000 μm.

A fifth aspect of the present invention relates to the use of the n-type doped metal chalcogenide quantum dot solid-state element obtained according to the method of the first aspect of the present invention for lasing, in the presence of an appropriate optical cavity, for superluminescence, when an optical cavity is not used.

BRIEF DESCRIPTION OF THE FIGURES

In the following some preferred embodiments of the invention will be described with reference to the enclosed figures. They are provided only for illustration purposes without however limiting the scope of the invention.

DESCRIPTION OF THE PREFERRED EMBODIMENTS

In the present section, by means of several experiments detailed below, the present inventors demonstrate the feasibility and good results offered by the present invention, specifically for embodiments for which the metal chalcogenide quantum dot solid-state elements are PbS quantum dot solid-state elements, and sulphur atoms are partially substituted by iodine atoms.

Here the present inventors demonstrate infrared stimulated emission tuneable across the optical communication band based on PbS CQDs. The present inventors have employed robust heavily doped PbS CQD solid-state conductive elements that reach gain threshold at the single exciton regime, representing a four-fold reduction from the theoretical limit of an eight-fold degenerate system. They also exhibit room temperature stimulated emission near the single exciton regime, at a threshold two orders of magnitude lower than prior reports [11,12], and a net modal gain in excess of 110 cm$^{-1}$, the highest reported to date in the infrared.

Figure 1:
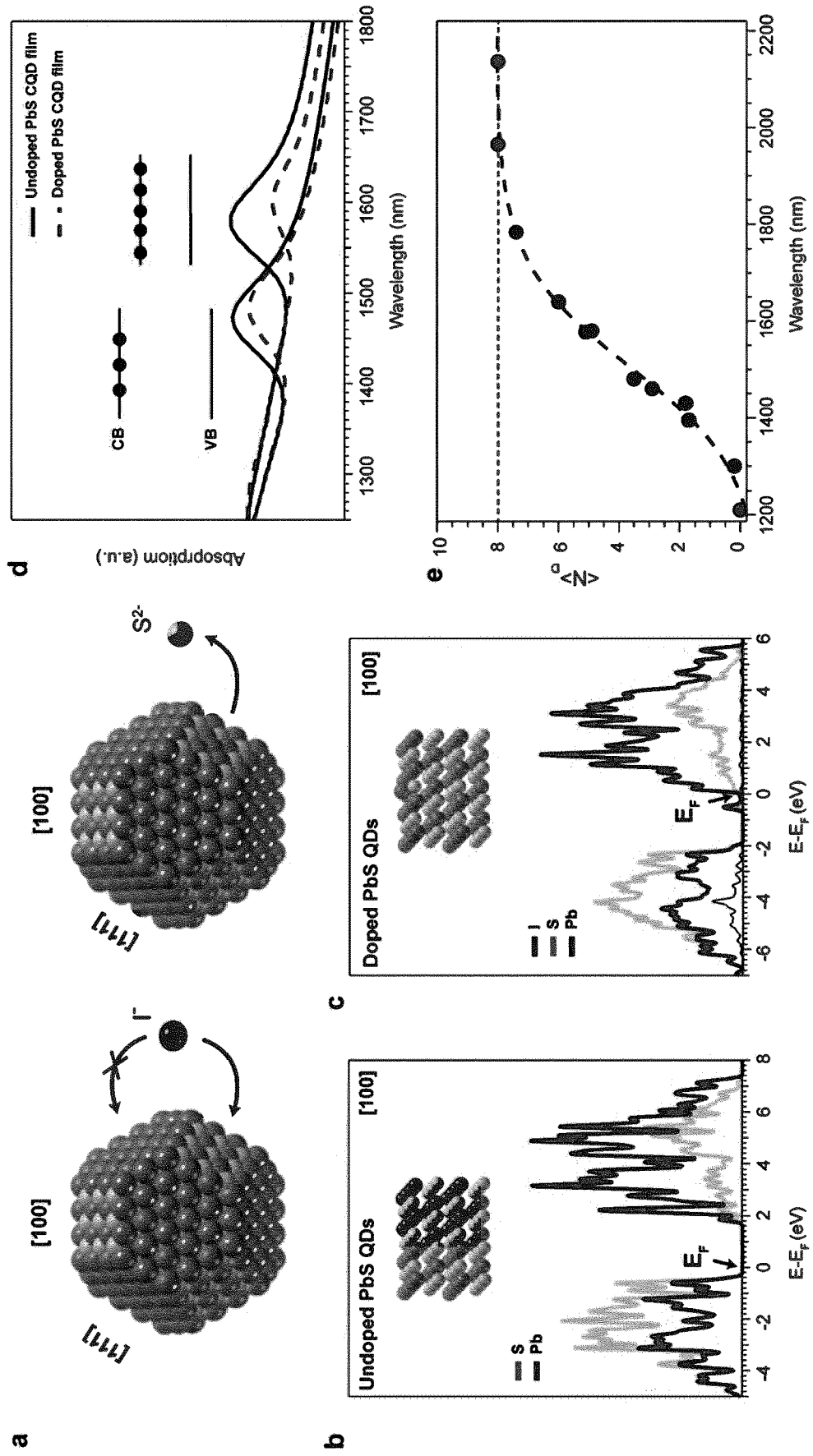
FIG. 1. Doping in PbS CQDs films, according to the method of the first aspect of the present invention. a, Schematic representation of the S2-substitution to I— in (100) surface in large, cuboctahedral-shaped PbS CQDs b,c, Calculated density of states (DOS) of the (100) surface before and after I-substitution showing that the Fermi level, EF is shifted to the conduction band d, Absorption spectra of two representative PbS CQD films, before and after doping. The CQD sizes are 5.5 nm and 6.1 nm with respective exciton peaks at 1480 nm and 1580 nm (solid black lines). After doping of the CQD films the absorption bleaches (red dash lines) e, The number of electrons in the conduction band, upon doping, depends on the size of the CQD due to the degree of (100) surface presence that enables doping. The dots represent the experimentally extracted number of electrons from measuring the bleaching of the absorption at the exciton peak overlaid with a sigmoidal function (black dash line) as a guide to the eye.
Figure 4:
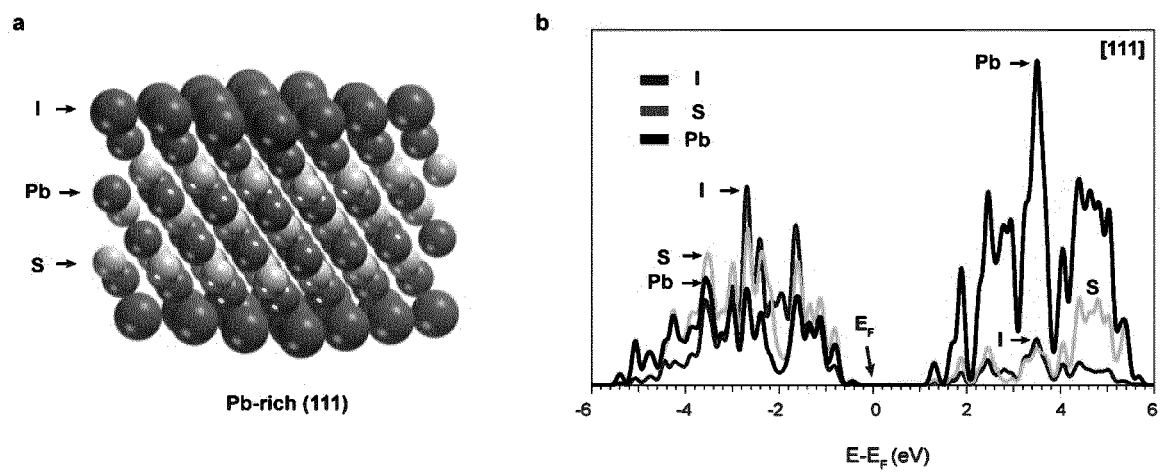
FIG. 4. Schematic representation of (111) surface with Iodine passivation (a) Calculated density of stated of the (111) surface (b).
Figure 5:
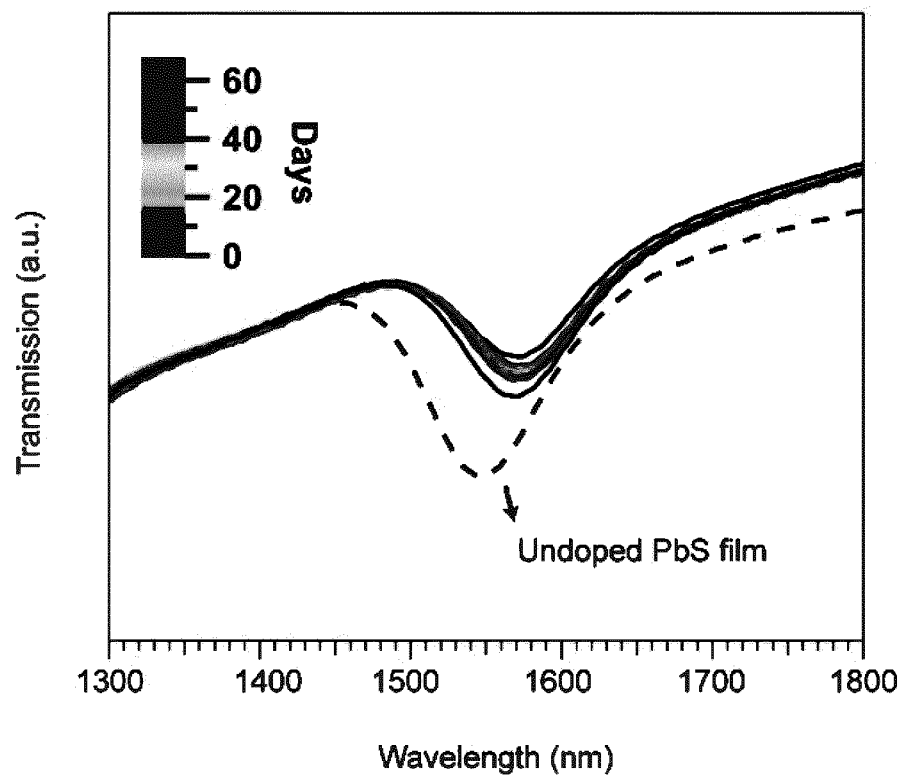
FIG. 5. Series of absorption spectra of doped PbS CQD film for a period of 67 days (solid lines). The sample was kept in ambient conditions with continuous exposure of ambient light. The respective undoped films is plotted for comparison (dash line).

The present inventors posited that a CQD element, such as a film, robustly doped in the heavy doping regime, can address this challenge by utilizing the doping electrons present in the first excited state of the CQDs (conduction band) to reach the population inversion condition at reduced pumping fluence. To test the here proposed hypothesis, the present inventors employed a method to dope PbS CQDs in the heavy doping regime. The doping mechanism takes place by iodine substitution of surface sulphur sites on (001) exposed surface facets (FIG. 1a). As evidenced by DFT calculations on PbS (001) surfaces, there is evident n-type doping upon iodide substitution as illustrated in FIG. 1b. Iodide binding on (111) surfaces on the other hand serve as passivant without causing any strong doping effect [21] (see FIG. 4). In order to quantify the doping the present inventors monitored the exciton bleaching of the QDs (quantum dots) in absorption. Absorption spectra, as shown in FIG. 1d, illustrate that band-edge absorption of the doped PbS CQD films is bleached as a result of the population of the first excited state upon doping. Because (001) surfaces are progressively exposed with increasing PbS CQD size, the doping efficacy of the process increases with the size of the dots. FIG. 1e shows that particles smaller than 4 nm in diameter do not undergo this doping process due to the lack of (100) exposed facets, whereas in particles with an exciton peak of more than 1800 nm (~7.5 nm) the conduction band is fully filled with 8 electrons (FIG. 1e). It is noteworthy that the doped CQD films are stable at room temperature and ambient conditions for a period of more than 2 months (see FIG. 5).

Figure 2:
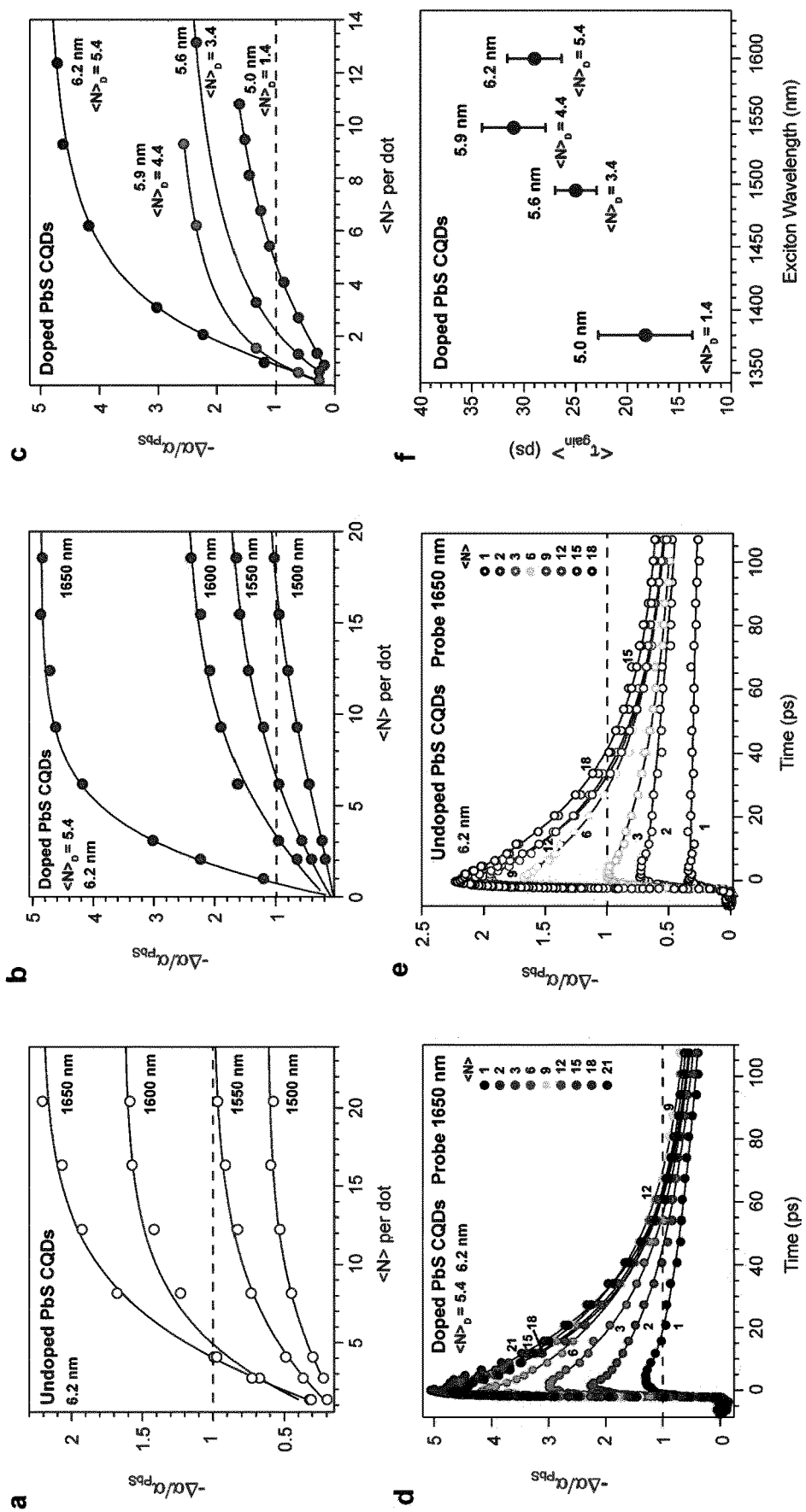
FIG. 2. Optical gain and transient absorption in PbS CQD solids. The gain spectra have been obtained in various probing wavelengths and different pump fluencies which are presented as exciton occupancy, <N> for both doped and undoped CQD films. The optical gain arises at the point that $-\Delta\alpha/\alpha_{PbS}>1$ (horizontal black dash line). a, The gain spectra of the 6.2 nm PbS CQD (exciton peak at 1600 nm) shows gain threshold at $<N>_{thr}=4$. b, The corresponding doped film exhibits a drastically reduced gain threshold at $<N>_{thr}=0.9$ at 1650 nm. c, Comparison of gain spectra of various sized doped PbS CQDs films, possessing different initial doping values. The $<N>_{thr}$ reduces upon increasing initial doping. d,e, The transient absorption curves of the aforementioned doped and undoped samples at the probing wavelength of 1650 nm show that in the regime below optical gain the carrier dynamics follow a mono-exponential decay correlated with the band-edge relaxation. In the optical gain regime another fast component appears which is assigned to the gain lifetime. f, Average gain lifetime $<\tau_{gain}>$ of different CQD sizes calculated from a range of pumping intensities while the error bars present the lowest and the highest measured values.

Transition Absorption PbS CQD Films:

To verify the hypothesis of reaching single exciton gain threshold in doped PbS CQD films, the present inventors performed transient absorption (TA) studies in undoped PbS CQD films as well as a series of doped PbS CQD films with variable initial electron occupancy doping $<N>_D$, determined by their size (FIG. 1d). The undoped PbS CQD films demonstrate optical gain threshold $<N>_{thr}$—expressed in excitons per dot—of four, as expected from the 8-fold degeneracy (FIG. 2a). Upon doping, the $<N>_{thr}$ reduces and for the case of initial doping $<N>_D$ of 5.4 the $<N>_{thr}$ reaches a value of 0.9 excitons per dot (FIG. 2b). This four-fold reduction of the gain threshold upon doping outperforms the two-fold reduction reported in CdSe based CQD systems [14]. By varying the initial doping of the CQD films, according to the size-doping dependence shown in FIG. 1e, the present inventors have measured $<N>_{thr}$ values of 4.7, 2.3, 1 and 0.9 excitons per dot for QD sizes with diameter (initial doping) of: 5.0 nm ($<N>_D$=1.4), 5.6 nm ($<N>_D$=3.4), 5.9 nm ($<N>_D$=4.4) and 6.2 nm ($<N>_D$=5.4) respectively (FIG. 2c). This finding further corroborates the here proposed hypothesis of the effect of doping on the optical gain threshold.

The corresponding transient absorption of the undoped and doped films (FIG. 2d-e) shows a mono-exponential decay for $<N>$ below the gain threshold while above the gain threshold the lifetime traces are fitted with a bi-exponential decay. The nearly mono-exponential lifetime below the gain threshold is ranging for both doped and undoped samples from 300-600 ps which the present inventors tentatively attribute to band-edge recombination. On the other hand, at the optical gain regime, a second ($\tau_2$) fast component is rising. The present inventors assign the fast $\tau_2$ component to the gain lifetime while the long $\tau_1$ component is likely due to band-edge recombination (100-300 ps). This can be further illustrated by FIGS. 7 and 8.

Figure 7:
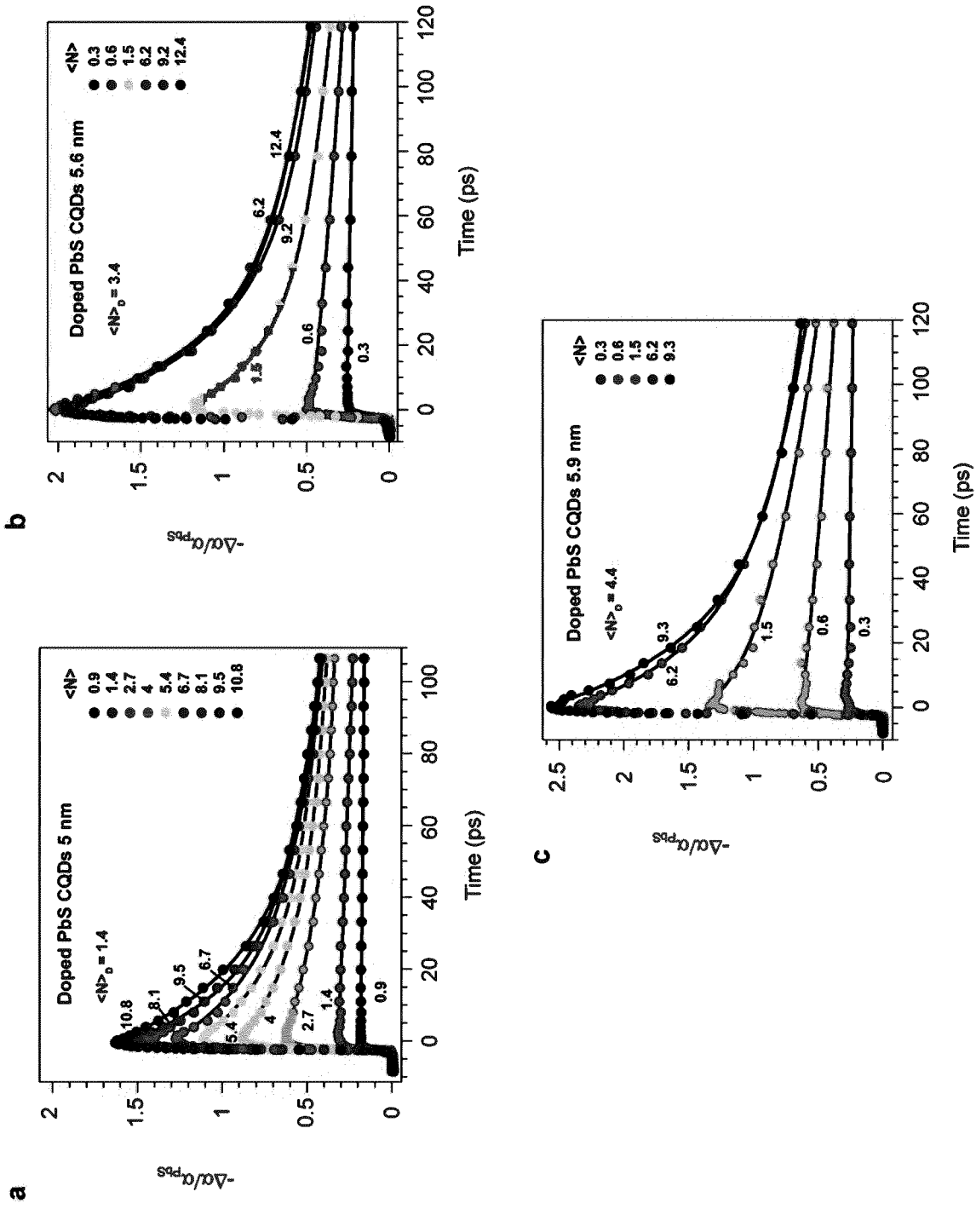
FIG. 7. Transient absorption spectra of doped PbS CQD of 5 nm (a) 5.6 nm (b) and 5.9 nm (c) sizes. The lifetime traces have been fitted with mono-exponential decay below the gain threshold $-\Delta\alpha/\alpha_{PbS}=1$, while at the gain regime the lifetimes have been fitted with bi-exponential decay (solid black line).

Particularly, the diagrams of FIG. 7 show the transient absorption spectra of doped PbS CQD of 5 nm (a) 5.6 nm (b) and 5.9 nm (c) sizes. The lifetime traces have been fitted with mono-exponential decay below the gain threshold $-\Delta\alpha/\alpha_{PbS}$=1, while at the gain regime the lifetimes have been fitted with bi-exponential decay (solid black line).

Figure 8:
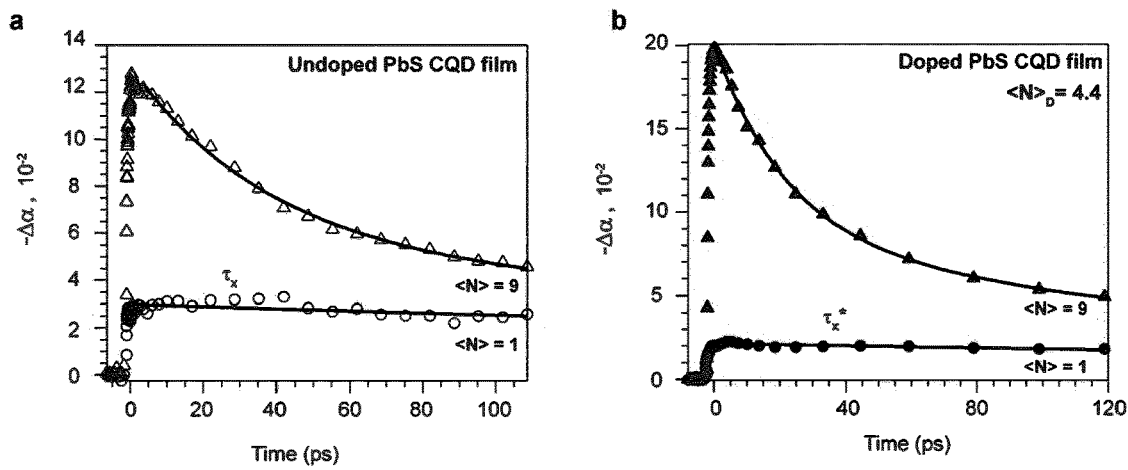
FIG. 8. Representative fitting and analysis of the undoped (a) and doped (b) samples at single exciton and multi-exciton regime.

FIG. 8 shows the representative fitting and analysis of the undoped (a) and doped (b) samples at single exciton and multi-exciton regime. The transient fitting was carried out with a mono-exponential decay $I(t)=y_0+A_1 e^{-(t-t_0)/\tau_1}$ and for bi-exponential decay $I(t)=y0+A_1 e^{-(t-t_0)/\tau_1}+A_2 e^{-(t-t_0)/\tau_2}$ functions.

The fitting parameters of the transient absorption measurements are summarized at the table below:

|  | $A_1$ | $\tau_1$ (ps) | $A_2$ | $\tau_2$ (ps) |
|---|---|---|---|---|
| Undoped $<N>$ = 1 | 0.029 | 613 | — | — |
| Undoped $<N>$ = 9 | 0.049 | 490 | 0.073 | 38 |
| Doped $<N>$ = 1 | 0.0214 | 614 | — | — |
| Doped $<N>$ = 9 | 0.08 | 217 | 0.118 | 22 |

Table 1 Furthermore, extracting the gain lifetime from the transient absorption data at the probing wavelength of the highest gain value (FIG. 2f) the present inventors found an average gain lifetime of 27 ps in doped CQD films while the error bar represent the lowest and the highest values obtained in different pumping photon densities (see also FIG. 7). Slightly longer average gain lifetime of 35 ps is observed in undoped samples. It is noteworthy, that despite the presence of doping, Auger processes do not prevent reaching the gain regime. This can be due to the fact that gain lifetime is faster than the Auger and therefore competes favourably to it and/or Auger process is suppressed in this system.

Photoconductivity Measurement:

To shed further insights, having conductive films, the present inventors have performed transient photoconductivity measurements [22] that, as will be shown below, yield a very low value for the Auger coefficient of $10^{-31}$ cm$^6$s$^{-1}$, lower than prior reports for PbS CQDs [23]. This is likely due to the conductive nature of those films [22].

Figure 3:
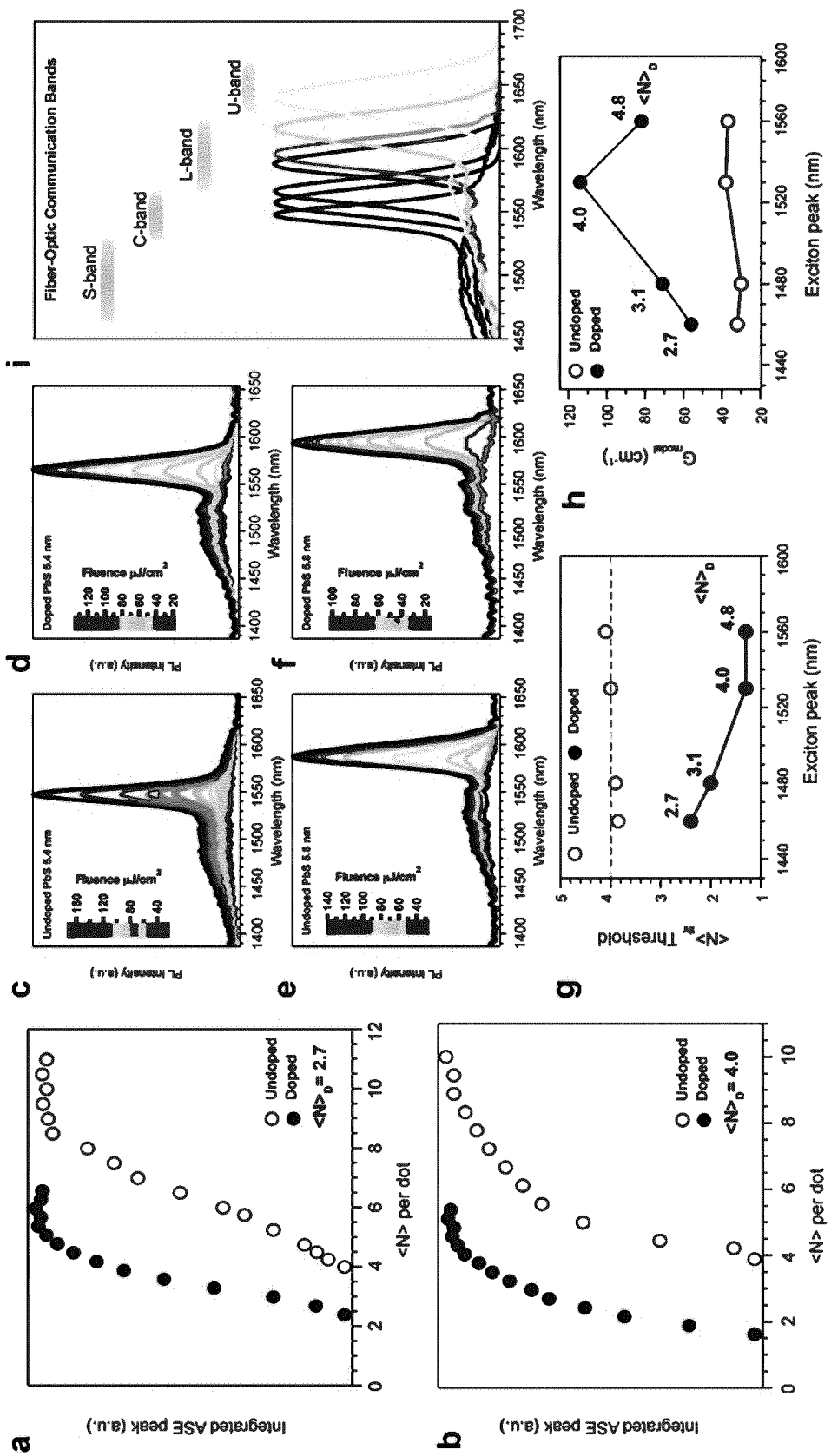
FIG. 3. ASE and VSL measurements in PbS CQD films. The present inventors collected the ASE and the VSL spectra in a series of PbS CQD films both doped (according to the method of the first aspect of the present invention) and undoped, while here the present inventors show selective data for two samples with $<N>_D$ of 2.7 and 4. The present inventors have excited the samples with a stripe-shaped laser beam at 800 nm with a Ti:Saphire femtosecond laser with pulse width of 80 fs and repetition rate of 1 KHz at ambient conditions. a,b, The ASE area has been calculated by fitting the ASE peak with a Gaussian function while the photon density it is shown in terms of exciton occupancy. The solid dot represent the integrated ASE area of doped and the hollow dots the undoped samples. The present inventors further confirm that the undoped samples show ASE threshold $<N>_{thr}=4$, while the doped samples show $<N>_{thr}<4$ while both ASE signal are saturated for a total occupancy of 8 c-f, The corresponding PL spectra of these sample in a range of pumping intensities with a threshold of 70 μJ/cm$^2$ for the undoped and down to 25 μJ/cm$^2$ for the doped films g, Summarizing ASE thresholds in terms of exciton occupancy in PbS CQD of different sizes h, The modal gain in the undoped films remains stable at 30 cm$^{-1}$ while in doped samples is increased with a peak value of 114 cm$^{-1}$ i, Collective ASE spectra from a series of PbS CQD films shows the tunability of the ASE peak from 1530 nm to 1650 nm, within the range of the fibre-optic communication bands.

Indeed, the dependence of the photocurrent density on the excitation intensity was investigated to understand the mechanism of photo-carrier generation in the chemically treated elements following a previously reported procedure [33]. The photocurrent was collected at a voltage bias of 20 V. In FIG. 3 the present inventors show the variation of photo-current as a function of incident photon flux for different ligand treated PbS QD solids.

Figure 6:
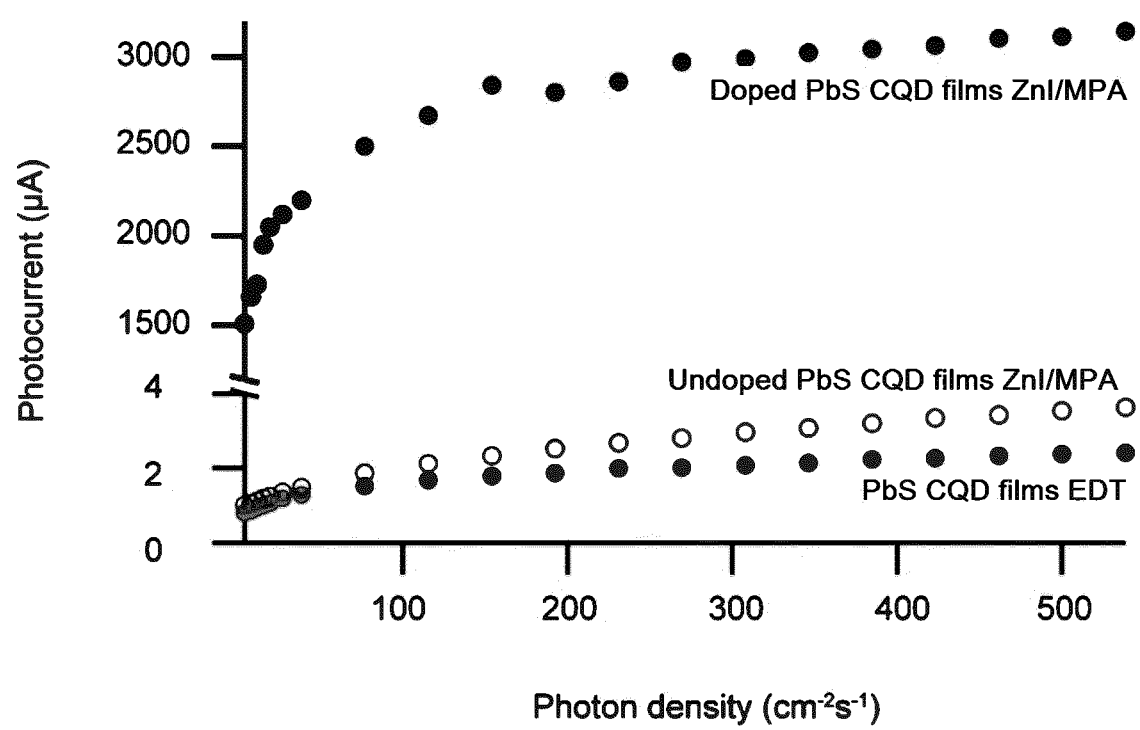
FIG. 6. The variation of photocurrent as a function of absorbed photon-flux in doped and undoped PbS CQD films treated with ZnI2/MPA and EDT for comparison.

The standard EDT (1,2-ethanedithiol) treated and the according to the present invention ZnI$_2$/MPA treated films showed different behaviour with high photon flux as the higher degree of photocurrent saturation observed in case of EDT treated film [33]. For doped ZnI$_2$/MPA treated film, the photocurrent increased nearly 3 orders of magnitude due to the improvement in the mobility. The photon flux dependence of the photo-current showed a similar trend of the ZnI$_2$/MPA treated undoped materials. To quantify the recombination dynamics involving more than one charge carrier taking place in the QD solids, the following equations have been considered, $$\frac{dn}{dt} = G - an - bn^2 - cn^3 \quad (1)$$

$$I \propto n \quad (2)$$

Where G is the generation rate, an is the carrier trapping rate, bn$^2$ is the radiative recombination rate and cn$^3$ is the Auger recombination rate. Photocurrent I is proportional to the charge carriers n. The plots are fit in FIG. 6 using equations 1 and 2 to get the idea of different recombination mechanisms in the QD solids. As the proportionality constant of the equation 2 is not known, proper fitting parameters to be found with b/a$^2$ and c/a$^3$ calculations. The fitting parameters are summarised in Table 2 below.

TABLE 2

| DEVICE | b/a$^2$ (s cm$^3$) | c/a$^3$ (s$^2$cm$^6$) |
|---|---|---|
| PbS_EDT treat | 3.4 × 10$^{-14}$ | 3 × 10$^{-27}$ |
| Undoped PbS_ZnI$_2$/MPA | 1.2 × 10$^{-14}$ | 1.2 × 10$^{-31}$ |
| Doped PbS_ZnI$_2$/MPA | 9 × 10$^{-15}$ | 1 × 10$^{-31}$ |

The radiative (bi-molecular) rate parameters showed nearly similar values for all the cases whereas there is a distinct difference between EDT treated and ZnI$_2$/MPA treated films in case of Auger coefficient. ZnI$_2$/MPA treated doped and undoped both PbS QD solids showed a much lower Auger coefficient compared to the standard EDT treated solids. This confirms fast dissipation of charges in QD solids based with ZnI$_2$/MPA treatment (both doped and undoped).

Figure 9:
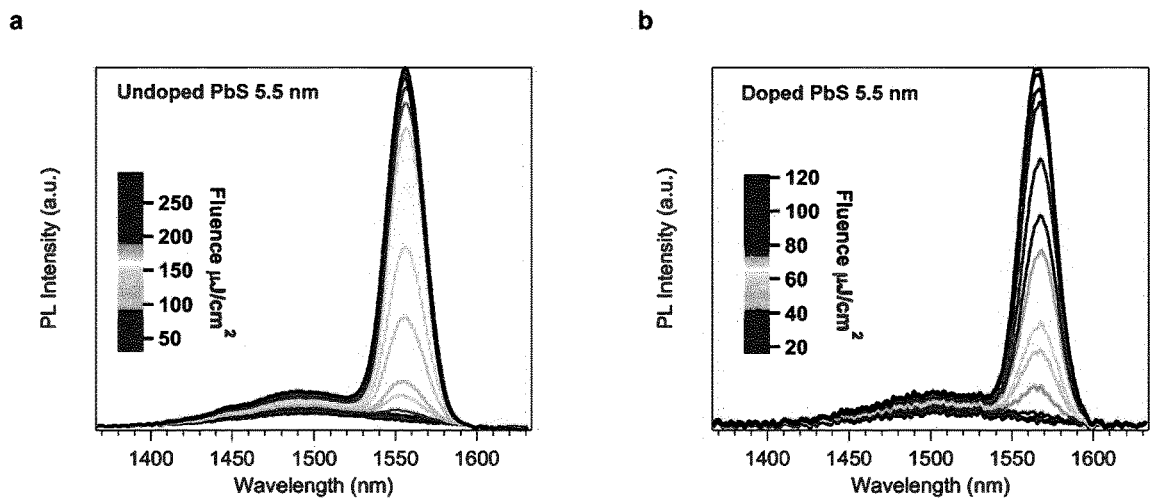
FIG. 9. Amplified spontaneous emission measurements of doped and undoped PbS CQD solids at PbS CQD sizes of 5.5 nm (a)-(b) and 6.0 nm (c)-(d).
Figure 10:
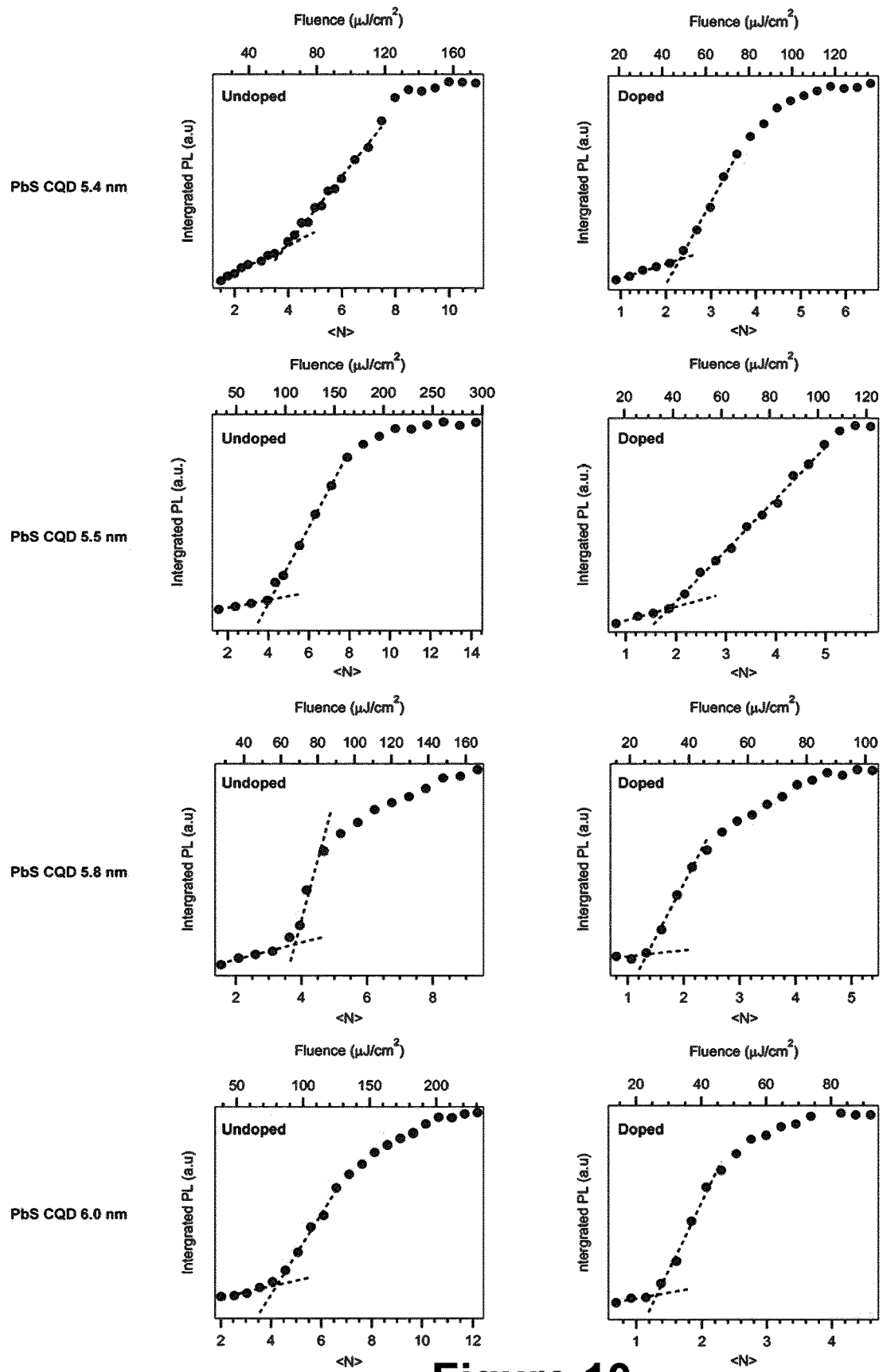
FIG. 10. Power dependence measurements of all PbS CQD films in terms of exciton occupancy versus the Integrated PL intensity (S-curves).

Power Dependence ASE Measurements:

Optical gain is a prerequisite for stimulated emission. Having achieved this, next the present inventors performed amplified spontaneous emission (ASE) measurements of thin films obtained according to the method of the first aspect of the present invention. In line with the TA measurements the present inventors observed stimulating emission from both doped and undoped samples (see FIG. 9). The present inventors calculated the stimulated emission occupancy threshold $<N>_{thr}$ by fitting the integrated PL spectra (see FIG. 10) from the power dependent S-curve of all the samples. In FIGS. 3a,b the present inventors plot the integrated ASE peak as a function of exciton occupancy and the respective power dependence measurement of two representative PbS sizes of 5.4 nm ($<N>_D$=2.7) and 5.8 nm ($<N>_D$=4.0) (FIG. c-f). All the undoped samples have an $<N>_{thr}$ of 4, in agreement with the TAS measurements of FIG. 2, and the ASE signal is saturated when 8 electrons have fully populated the conduction band. Power dependence measurement of those samples are shown in FIG. c-f positioning the stimulating emission peak in wavelengths above 1500 nm. The sharp ASE peak has an average FWHM of 14 meV, characteristic of a stimulated emission process and comparable with reported values in the visible from CdSe-based systems [14]. The stimulated emission threshold occupancy is summarized in FIG. 3g. The undoped samples preserve a constant value of $<N>_{thr}$ of 4 independent of their size, whereas in the case of doped CQDs increasing their size—and thereby the initial doping occupancy—the stimulated emission threshold decreases to a minimum value of 1.3 excitons in agreement with the transient absorption measurements.

Figure 11:
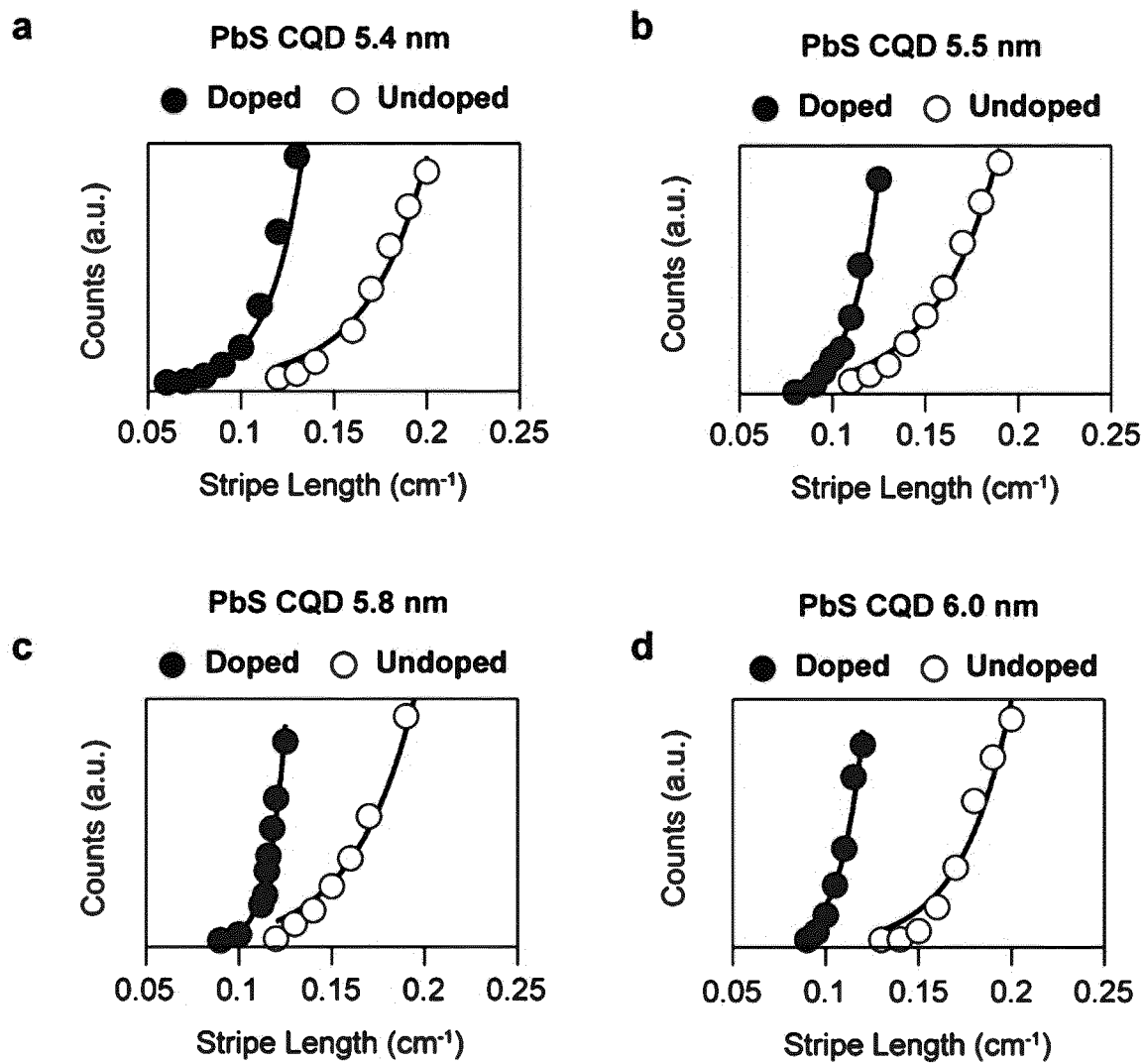
FIG. 11. ASE peak intensity versus stripe length for both doped and undoped CQD films of various PbS sizes.

A figure of merit of paramount importance for applications in optical amplification and lasing is the net modal gain of the material. The present inventors have experimentally measured the net modal gain g$_{modal}$ using the variable stripe length (VSL) technique, from the measured data shown in FIG. 11 for both doped and undoped CQD films of various PbS sizes.

The variable strength dependence data have been collected at the pump fluence in the saturation regime of the ASE signal. In order to extract the net modal gain values the data have been fitted with the following function:

$$I(\lambda) = \frac{A(\lambda)}{G(\lambda)}(e^{G*L} - 1)$$

Where:
G: net modal gain coefficient
I: photoluminescence Intensity
L: stripe length
A: spontaneous emission growth parameter The present inventors report an average g$_{modal}$ of 30 cm$^{-1}$ nearly constant for all the undoped samples (FIG. 3h). Upon doping g$_{modal}$ increases up to a value of 114 cm$^{-1}$ for an $<N>_D$ of 4, when the conduction band is half filled due to doping. This modal gain value outperforms prior reports from HgTe infrared CQDs with g$_{modal}$ of 2.4 cm$^{-1}$ based on trap-to-band ASE [24], Er-doped fibre systems with values in the range of 0.01-0.1 cm$^{-1}$ and compares favourably to costly epitaxial III-V multi quantum well and quantum dot systems [25]. For the first time, the present inventors demonstrate nearly full coverage in the whole optical fibre communication spectrum (FIG. 3i) from a solution processed material, extending beyond the spectral coverage of Er-doped fibre systems. The tuneable spectral coverage across the infrared taken together with the high gain values and the low threshold represent a significant advance towards the deployment of CQD solution processed lasers in the infrared. Most importantly, ASE has been demonstrated, for the first time, in conductive films of CQDs, of paramount practical importance for the realization of electrically pumped CQD lasers.

Calculating the Occupancy Per Dot:

In order to calculate the number of the occupancy per dot the present inventors carefully measured the thickness of each CQD film, $H_{film}$ using profilometry. Therefore, the number of QDs within the excitation area $A_{exc}$ is determined:

$$N_{CQD} = \frac{A_{exc} H_{film} 0.74}{V_{CQD}} \quad (1)$$

Where $V_{CQD}$ is the volume of the quantum dots.

Next the energy required to generate one N=1 carrier per NC was calculated. For this reason, both the transmission (T) and the reflection (R) spectra of the film at 800 nm were measured.

$$N_{photons}^{<N>=1} = \frac{N_{CQD}}{(1-T)(1-R)} \quad (2)$$

The photon energy at the excitation wavelength (800 nm) is given by:

$$E_{photon}^{800} = \frac{hc}{\lambda} = 2.483 \ 10^{-19} J \quad (3)$$

Where h is the Planck's constant, c is the speed of light, and $\lambda$ the wavelength of the radiation.

So the incident energy required for N=1:

$$E_{CQD}^{<N>=1} = N_{photons}^{<N>=1} \times 2.483 \ 10^{-19} \quad (4)$$

Methods:

PbS CQDs Synthesis:

PbS QDs synthesis was adapted from a previously reported multi-injection procedure. Briefly, 0.446 g lead(II) oxide (PbO, 99.999% Pb, Strem Chemicals), 50 mL 1-Octadecene (ODE, 90%, Alfa Aesar) and 3.8 mL oleic acid (OA, 90%, Sigma Aldrich) were introduced in 3-neck, round bottom flask and degassed overnight, under vacuum at 90° C. Then the reaction temperature was increased at 95-100° C. under Argon and 60 μL of Hexamethyldisilathiane ((TMS)$_2$S, Sigma Aldrich) diluted in 3 ml of ODE was swiftly injected. After 6 minutes, a second solution of 75 μL (TMS)$_2$S in 9 ml ODE was injected dropwise in a rate of 0.75 mL/min. The reaction was constantly monitored with aliquots and is was stop when at the desirable QD size. At that point both the heating and the injection was stopped and the solution was let cool down slowly at room temperature. QDs were purified three times by precipitation with anhydrous acetone and ethanol and re-dispersed in anhydrous toluene. Finally, the concentration was adjusted to 30 mg/mL and the solution was bubbled with N$_2$ in order to minimize to oxidation of the QDs.

Doped PbS CQD Films:

The ad-hoc PbS CQDs (30 mg/ml) were spin-cast onto soda-lime glass substrates (1 cm×1 cm) at the speed rate of 2500 rpm for 20 s. The film was treated with ZnI$_2$/MPA (7 mg/ml of ZnI$_2$ dissolved in 0.01% of MPA in Methanol) solution for 5 s and the spin-coater was started again to dry the film, while 300 μL was MeOH were drop-casted to wash away the remain ligands. This procedure was repeated till the film thickness of ~110 nm (4-5 layers). The film thickness was measured with profilometer. The PbS CQD films were doped after the capping with Al$_2$O$_3$ with atomic layer deposition (ALD).

Atomic Layer Deposition:

Al$_2$O$_3$ deposition was performed in a GEMStar XT Thermal ALD system. High-purity trimethylaluminium (TMA), purchased from STREM Chemicals Inc., was used as Al precursor. Pure H$_2$O was used as 0 precursor. The deposition was carried out at 80° C. Before the process, the reaction chamber was pumped down and subsequently filled with pure nitrogen up to a pressure of approximately 0.56 mbar. The TMA and H$_2$O manifolds were maintained at 150° C. during gas supply. Each layer of Al$_2$O$_3$ was formed by applying a 15-ms pulse of H$_2$O at a partial pressure of 0.02 mbar, followed by a 50-ms pulse of TMA, at a partial pressure of 0.18 mbar. The waiting time between pulses was 15 s and 20 s, respectively.

Transmission and Absorption Measurements:

Room-temperature absorption measurements were taken under ambient atmosphere, using a Cary 5000 UV-Vis-NIR spectrometer.

Measurements of Doping Level by Optical Measurements:

Since, the $1S_e$ states of PbS are eight-fold degenerated (including spin), the number of electrons in the CB per dot, $n_{QD}$, can be calculated in a straightforward manner from the bleach of the first exciton transition. If $I_1$ and $I_2$ are defined as the integrated absorption strength of the excitonic transition of the undoped and doped samples, respectively, then $n_{QD}=8(1-I_2/I_1)$. Note that by saying undoped sample, the present inventors are assuming that the doping (whether p-type or n-type) of the samples without alumina is low enough to consider full valence band and empty conduction band.

Reflection Measurements of CQD Films:

Reflection measurements were obtained using a PerkinElmer Lambda 950 UV/Vis/NIR spectrophotometer equipped with a Universal Reflectance Accessory module.

Transient Absorption Measurements:

Transient absorption measurements were carried out using a titanium sapphire based ultrafast amplifier centred at 800 nm and generating 45 fs pulses at a repetition rate of 1 kHz. The optical setup utilized was a typical pump-probe non-collinear configuration. The main part of the fundamental energy from the amplifier was directed into a half wave plate and a thin film polarizer system to control the energy of the excitation pulse incident of the sample. The optical path of the pump beam included an optical chopper allowing the use of phase-sensitive detection thereby improving the signal-to-noise ratio. An optical parametric amplifier pumped with approximately 1 mJ of the fundamental 800 nm energy was used to generate the probe beam with wavelengths ranging from 1200 nm to 1700 nm. The probe beam optical path included a precise motorized translation stage to control the optical delay between the pump the probe beam. The probe beam was directed on the sample within the excitation area of the pump beam where changes in transmission and reflection were recorded simultaneously using lock-in amplifiers.

Amplified Spontaneous Emission Measurements:

For the ASE measurements the ultrafast laser pulse at 800 nm was directed through a cylindrical lens (focus length 15 cm) onto the sample at normal incidence. The stripe width was 700 μm while the stripe length was measured for every measurement in order to calculate the occupancy values (average value of 0.35 cm±0.05). The thickness the PbS CQD elements was ~110 nm in order to avoid over-estimation of the occupancy per dot. The emission was collected perpendicular to the incident beam using 6 cm focusing lens (5 cm diameter) and coupled into an Andor spectrometer (Shamrock SR-303) equipped with an InGaAs camera (iDus).

Photocurrent Measurements:

The QD thin films were prepared on the top of the Si/SiO$_2$ substrate with patterned Au electrode following the standard EDT (0.2%) and ZnI$_2$/MPA ligand treatments. The distance between two Au electrodes was fixed at 10 μm. 637 nm wavelength continuous laser (Vrotran stradus 637) was used to excite the QD films. All the measurements were performed in ambient conditions using an Agilent B1500A semiconducting device analyser.

Computational Details:

Density functional calculations of PbS have been performed by periodic plane-wave code Vienna ab initio simulation package VASP [26]. All structures have been optimized using the Perdew-Burke-Ernzerhof (PBE) [27] exchange-correlation functional, one of the most widely employed functionals of the generalized gradient approximation (GGA) family. It is important to mention that pure GGA functionals tend to underestimate electronic properties of materials such as band gaps. In order to account for the best possible and detailed description of the electronic structure of PbS, single-point calculations using the Heyd-Scuseria-Ernzerhof (HSE06) [28] hybrid exchange-correlation functional containing a fraction of nonlocal Fock exchange has been applied on the preoptimized PBE geometries. A plane-wave basis set with a 315 eV cutoff for the kinetic energy and a projector-augmented wave description of core-valence electron interactions were employed [29]. The one-electron Kohn-Sham states were smeared by 0.1 eV using Gaussian smearing. Finally, converged energies were extrapolated to zero smearing. All calculations were performed using a k-point Monkhorst-Pack [30] mesh of 3×3×1 in the reciprocal space for the unit cell of PbS. Relaxation of all atoms in the calculated models was carried out during the geometry optimization until forces acting on each atom became less than 0.01 eV/Å. In addition, the electron density was converged using a threshold of 10-6 eV for the total energy. No corrections for the zero-point energies were applied.

Two slab models consisting on 2×2×1 supercells were chosen to study PbS, one for the (100) surface and another for the (111) surface. The model of the stoichiometric (100) surface contains 32 atoms arranged in 4 layers, each layer formed by combination of Pb and S atoms, resulting in a nonpolar surface. Meanwhile, the (111) surface has been modelled using 28 atoms arranged in 3 Pb—S bilayers and an extra layer of Pb atoms, giving rise to two Pb terminations. The present inventors considered the PBE optimized lattice parameter to model all slabs (6.004 Å) [31], which is slightly larger than the reported experimental one of 5.929 Å [32].

The interaction of iodine with PbS surfaces has been modelled in two different ways, doping and adsorption of I atoms, respectively. Doping of PbS by iodine was modelled by substituting one of the S atoms located on the outmost layer of the (100) surface by an iodine. In turn, adsorption of iodine on the (111) surface has been modelled by covering the two Pb termination with I atoms, leading to a 100% coverage situation. Only the hexagonal-close-pack site has been considered in the present study. In order to account for the possible electron transfers emerging due to these two different processes, all calculations were spin-polarized.

Figure 12:
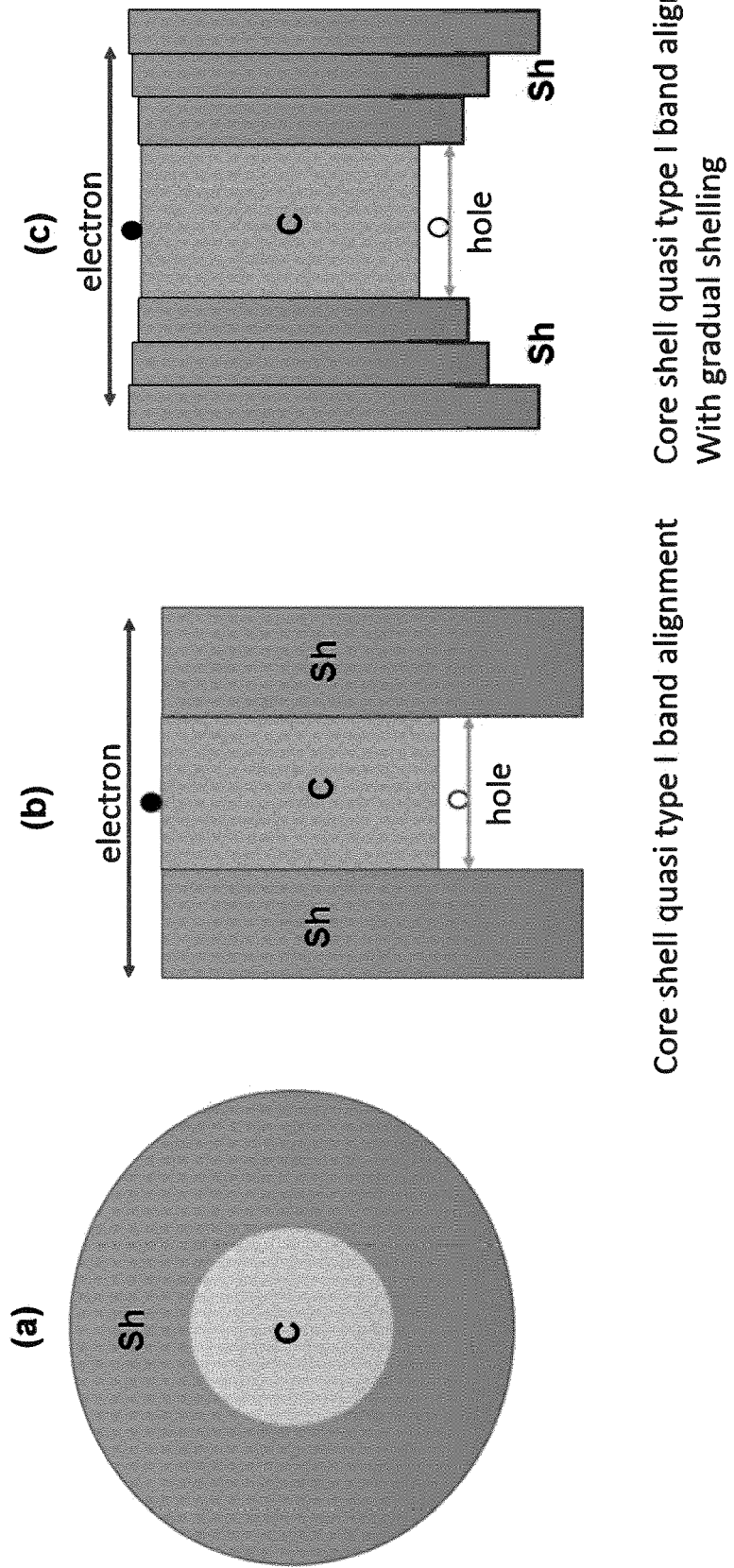
FIG. 12 schematically shows a cross-section core-shell type structure (a) for a metal chalcogenide quantum dot n-doped according to the method of the first aspect of the present invention, and corresponding band alignment diagrams without (b) and with (c) gradual shelling.

In this document, in a previous section, embodiments for which the n-doped metal chalcogenide quantum dots are of a core-shell type were described. One of those embodiments is illustrated by FIG. 12.

Specifically, FIG. 12(a) shows a cross-section of a core-shell type structure for a metal chalcogenide quantum dot comprising one core C covered by a shell Sh, while FIGS. 12(b) and (c) show two respective band alignment diagrams.

Particularly, diagram of FIG. 12(b) represents a core-shell quasi type-1 band alignment between the shell Sh and the core C, showing how the hole(s) is/are strongly confined in the core C, while the electron(s) are delocalized across the core-shell structure.

Similarly, diagram of FIG. 12(c) also represents a core-shell quasi type-1 band alignment between the shell Sh and the core C, but in this case with gradual shelling, i.e. for a shell Sh implementing a gradual change of the alloy making the same so that it causes a gradual shift of the energy levels and an increase of the bandgap of the shell Sh to provide strong confinement for the holes and weak confinement (if any confinement) to the electrons.

Figure 13:
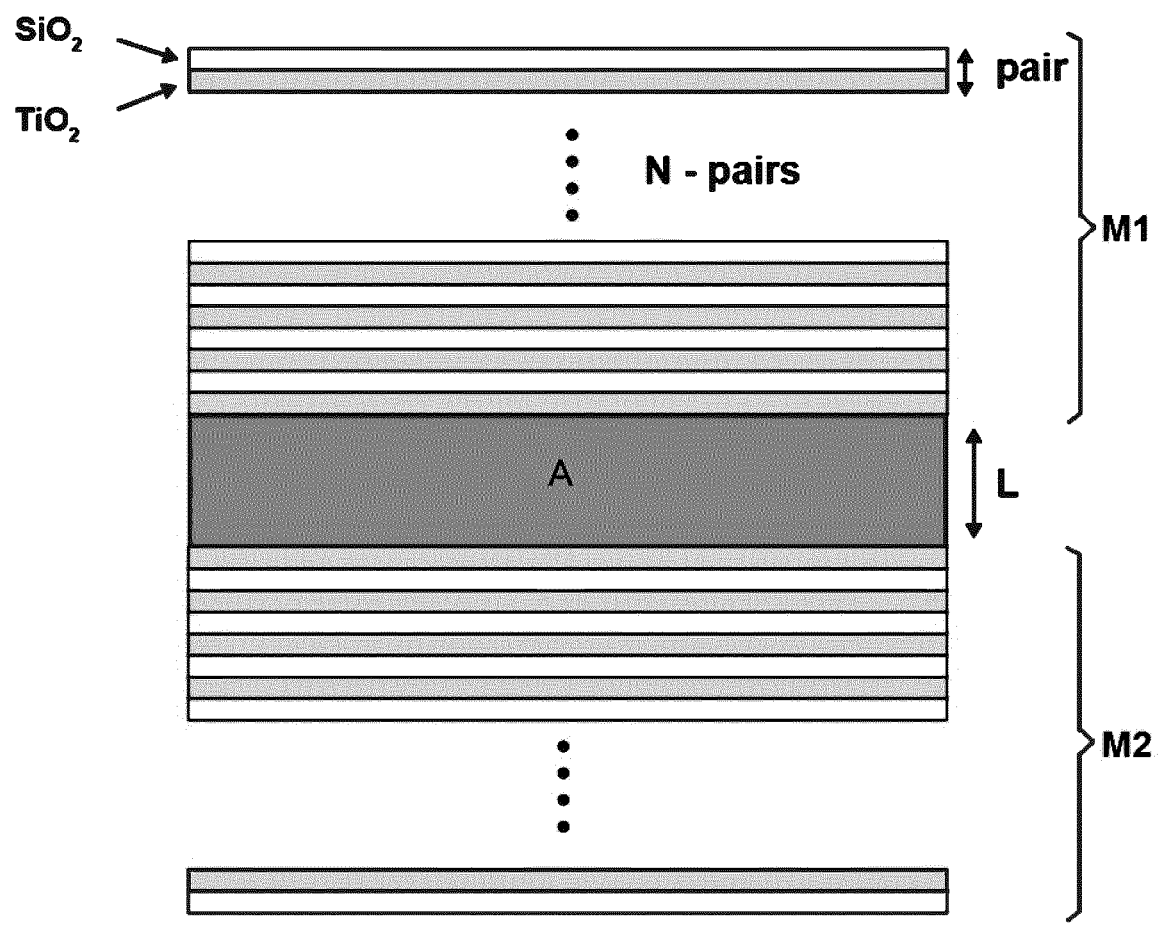
FIG. 13 schematically shows the light device of the fourth aspect of the present invention, for an embodiment for which the device implements a laser device having a VCSEL structure.
Figure 14:
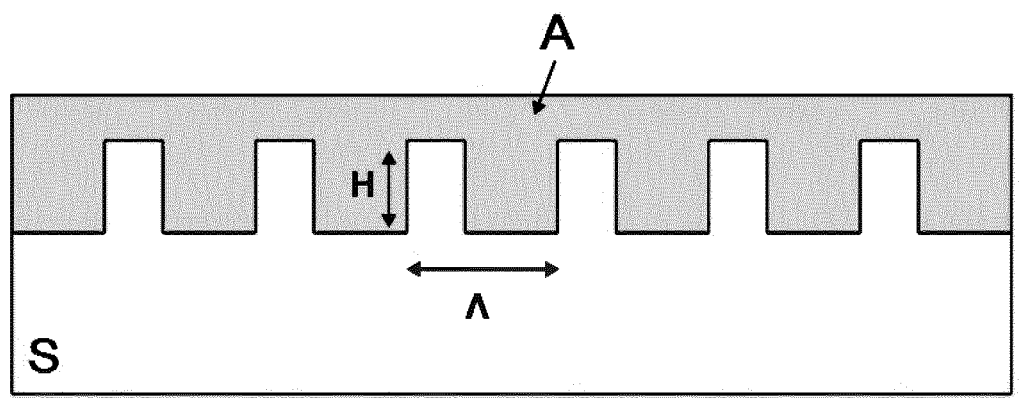
FIG. 14 schematically shows the light device of the fourth aspect of the present invention, for an embodiment for which the device implements a laser device having a DFB structure, for an embodiment (top view) for which the DFB laser structure operates as first-order and an embodiment (bottom view) for which the DFB laser structure operates as mixed order.
Figure 14:
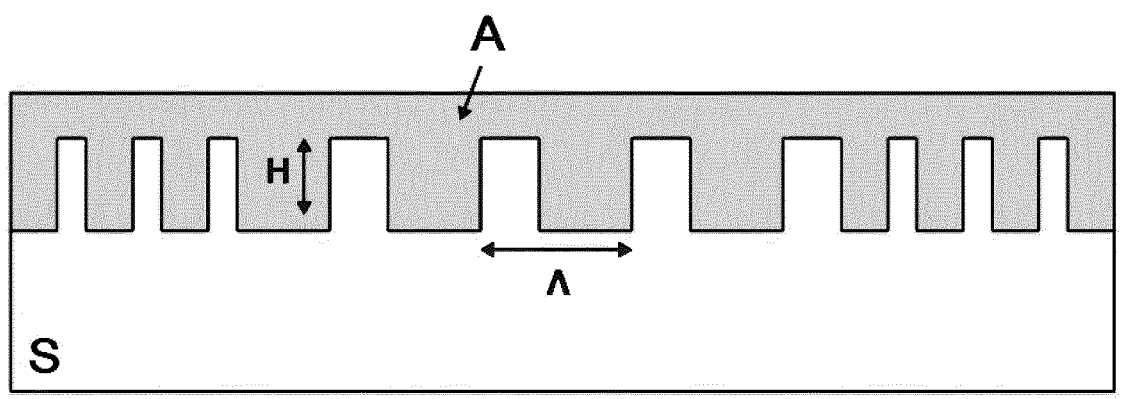
Figure 15A:
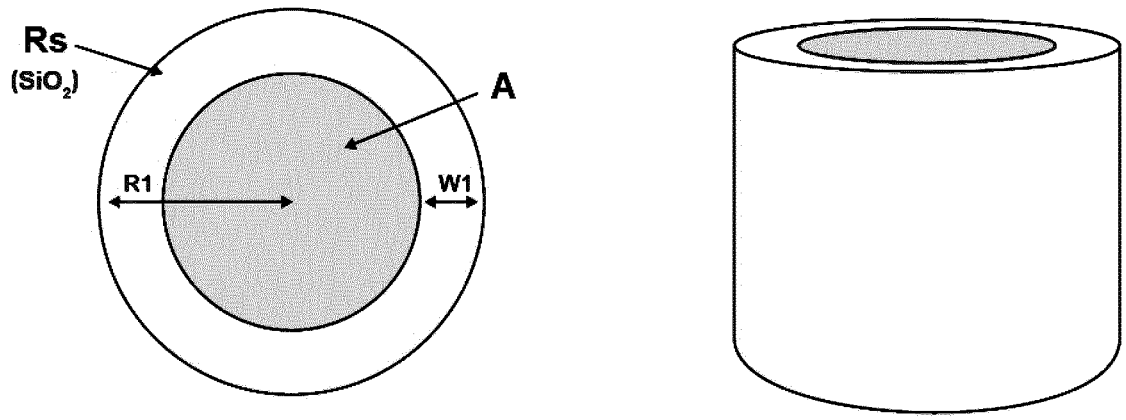
FIGS. 15a and 15b schematically show the light device of the fourth aspect of the present invention, for an embodiment for which the device implements a laser device having a WGM structure in the form of a hollow cylinder/fibre filled with the gain medium (FIG. 15a), and in the form of a solid cylinder/fibre with its outer surface covered with the gain medium.
Figure 15A:
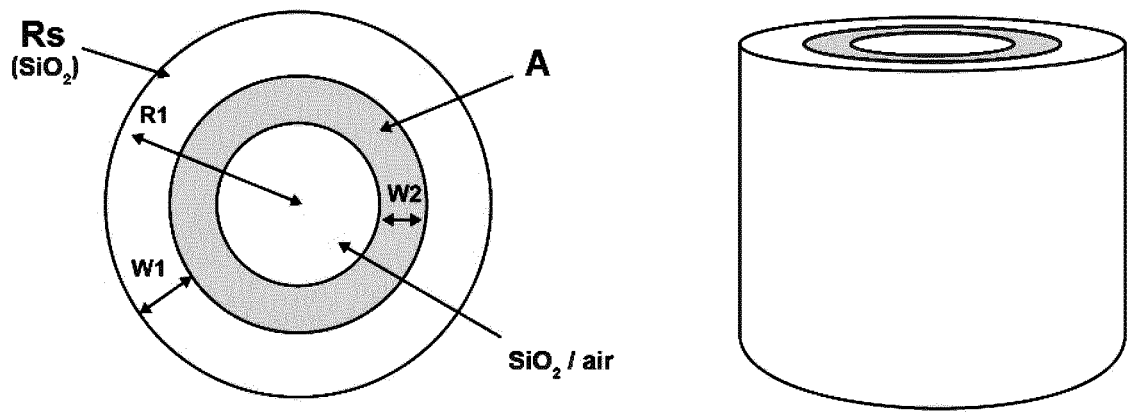

Finally, different structures for implementing a laser device according to corresponding embodiments of the light device of the fourth aspect of the present invention are shown in FIGS. 13, 14 and 15.

Vertical-Cavity Surface-Emitting Laser Structure (VCSEL):

Specifically, FIG. 13 schematically shows the light device of the fourth aspect of the present invention, for an embodiment for which the device implements a laser device having a VCSEL structure, which consists of two distributed Bragg reflector (DBR), M1 and M2, positioned in parallel for single wavelength emission or in a small angle (0.1°-5°) for spatial tuning of the principal laser mode across the area of the DBR. The gain material A, which in the present invention consist of the heavily n-doped colloidal quantum dot film, in this case in the form of a film, is deposited between the mirrors M1, M2 forming the DBR, thus forming a laser cavity.

The thickness L of the gain material is determined with the following function L=λ/2n, where n corresponds to the effective reflective index of the gain material A (e.g. PbS QD and Al$_2$O$_3$, PbS QD and Al$_2$O$_3$ and air). Taking under consideration that the refractive index of the QD medium, i.e. of the gain material A, ranges from 1.5 to 3, the thickness of the gain material for the telecom wavelengths spans from 200 nm to 1 μm.

The DBR mirror consist of two or more pairs of materials (e.g. SiO$_2$, TiO$_2$) forming a photonic band gap at the optical fibre optics communication wavelengths ranges from 1000 nm-2000 nm. The DBRs M1, M2 may have reflectivities within their photonic bandgap from 50% up to 99.999%. Preferably, the DBR through which laser emission is radiated has a lower reflectivity than the other DBR.

The optical excitation of the gain medium takes place through one of the DBRs, M1 or M2, outside their photonic bandgap (i.e. with light wavelength shorter that the low wavelength value of the DBR). Alternatively, optical excitation of the gain medium can take place from the side through a waveguiding mode within the gain medium. This waveguide can be implemented with the gain medium A, i.e. with the n-doped chalcogen quantum dots film, being integrated in a waveguide structure, for example embedded in a waveguide trench in a silicon substrate.

Distributed FeedBack Laser Structures (DFB):

As shown in FIG. 14, the DFB laser structure consist of a waveguide resonator formed by:
- a corrugated substrate S with corrugations implemented by periodically arranged structured elements (e.g. pillars, rectangles, trapezoids, etc.) in one or two dimensions resulting 1-D or 2-D interference grating respectively, where the periodic change of the refractive index that results the photonic band gap which depends on the height (H) of the structured element, periodicity ($\Lambda$) and the periodic change of the refractive index of the structured and the gain material; and
- the laser gain medium A arranged on top of the corrugated substrate S over the corrugations.

The waveguide resonator performs both functions, that of a waveguide and that of a resonator, as indeed light is wave-guided in the interface between the gain medium A and the substrate S, and in the presence of the corrugations this structure becomes resonant providing feedback (as a cavity).

The substrate S of the DFB laser structures is made of any of various materials including oxides, fluorides and/or doped oxides (e.g. $SiO_2$, $TiO_2$, $MgF_2$, $CaF_2$, ITO, FTO), Si, GaAs, and other organic polymeric materials like polyimide, PMMA (Polymethyl methacrylate), etc. The grating height can vary from 20 nm to 500 nm, while the periodicity ($\Lambda$) spans from 700-1400 nm. The DFB laser structures can operate as first-order (FIG. 14, top view), second-order or mixed order (second and first order, as shown in FIG. 14, bottom view), which is correlated to the periodicity or the mixed periodicity of the DFB structure.

The operating lasing wavelengths based on the aforementioned characteristics range from 1500 nm to 1800 nm. Moreover, the DFB structure with the use of conductive materials (e.g. ITO) can operate as electrically pumped laser. The DFB laser can be excited from one of the sides (up or down) or through a waveguide integration of the DFB structure in which light excitation is provided by coupling the light from the waveguide to the gain medium A, i.e. to the n-doped metal chalcogenide quantum dot solid-state element.

Whispering Gallery Mode Laser Structures (WGM):

For this kind of structure, the gain medium A comprising the heavily n-doped metal chalcogenide quantum dot solid-state element is coupled with Whispering Gallery mode (WGM) resonators Rs for single or multi laser mode at telecom wavelengths.

The structure of said WGM resonators Rs includes dielectric cylinders, disks, rings and fibre resonators, while the material from which they are made are oxides, fluorides and/or doped oxides (e.g. $SiO_2$, $TiO_2$, $MgF_2$, $CaF_2$, ITO, FTO).

The preferred operating lasing wavelengths are 1300 nm-1800 nm. The resonator diameter can vary from 50-1000 μm for the pertinent lasing wavelengths with Q-factors high as 105-106. The gain material A can be deposited on the ring, disk or sphere resonators Rs, or within or at the outer surface of the fibre and dielectric cylinders Rs.

Moreover, as shown in FIG. 15, the WGM resonators Rs (made of $SiO_2$ for the illustrated embodiments) can be hollow fibres/cylinders with diameter 50 μm-10000 μm (R1) and thickness (W1) of 1 μm-500 μm.

The inner space can be fully filled with the gain medium A, as shown in FIG. 15a top views, for a hollow cylinder/fibre resonator Rs, or forming a ring or tubular element with thickness (W2) of 0.2 μm-100 μm, as shown in FIG. 15(a) bottom views. Inside that ring or tubular member forming the gain medium A, the space can be filled either with air or oxides, fluorides and/or doped oxides (e.g. SiO2, TiO2, MgF2, CaF2, ITO, FTO).

Figure 15B:
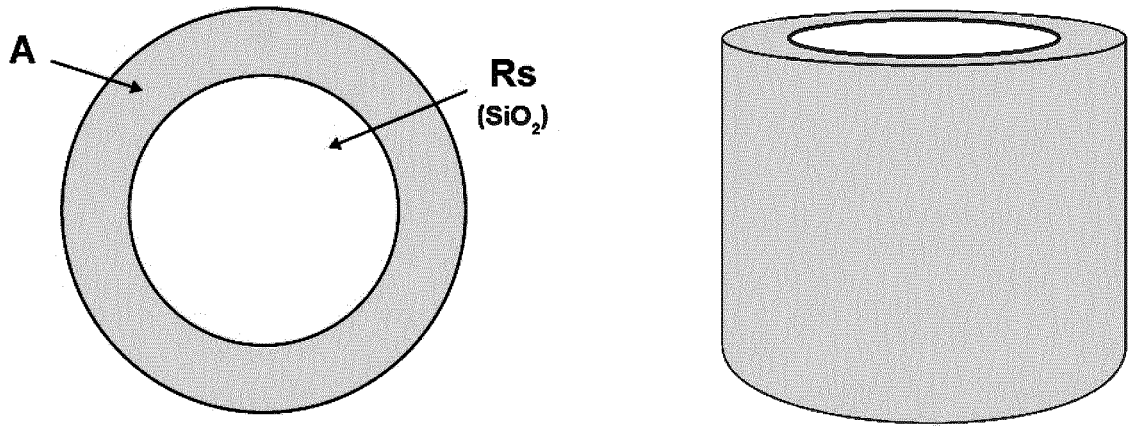

Alternatively, as shown in FIG. 15(b), the gain medium A can be deposited on the outer perimeter of an optical fibre or tubular resonator Rs.

At least for the embodiment of FIG. 15 top views, the n-doped metal chalcogenide solid-state element forming the gain medium A is not in the form of a film, but in the form of a solid cylinder filling the inner volume of the tubular resonator Rs.

A person skilled in the art could introduce changes and modifications in the embodiments described without departing from the scope of the invention as it is defined in the attached claims, such as providing any desired shape to the n-doped metal chalcogenide solid-state element (either in the form of a film or not) in order fit the requested application.

REFERENCES

[1] Huang, D. et al. Optical coherence tomography. Science 254, 1178-81 (1991).
[2] Liang, D. & Bowers, J. E. Recent progress in lasers on silicon. Nat. Photonics 4, 511-517 (2010).
[3] Atabaki, A. H. et al. Integrating photonics with silicon nanoelectronics for the next generation of systems on a chip. Nature 556, 349-354 (2018).
[4] Klimov, V. I. et al. Optical gain and stimulated emission in nanocrystal quantum dots. Science 290, 314-7 (2000).
[5] Christodoulou, S. et al. Chloride-Induced Thickness Control in CdSe Nanoplatelets. Nano Lett. 18, 6248-6254 (2018).
[6] Brus, L. Zero-dimensional 'excitons' in semiconductor clusters. IEEE J. Quantum Electron. 22, 1909-1914 (1986).
[7] Klimov, V. I. et al. Single-exciton optical gain in semiconductor nanocrystals. Nature 447, 441-446 (2007).
[8] Dang, C. et al. Red, green and blue lasing enabled by single-exciton gain in colloidal quantum dot elements. Nat. Nano. 7, 335-339 (2012).
[9] Adachi, M. M. et al. Microsecond-sustained lasing from colloidal quantum dot solids. Nat. Commun. 6, 8694 (2015).
[10] Grim, J. Q. et al. Continuous-wave biexciton lasing at room temperature using solution-processed quantum wells. Nat. Nanotechnol. 9, 891-895 (2014).
[11] R. D. Schaller, M. A. Petruska, and & Klimov*, V. I. Tunable Near-Infrared Optical Gain and Amplified Spontaneous Emission Using PbSe Nanocrystals. (2003). doi: 10.1021/JP0311660
[12] Sukhovatkin, V. et al. Room-temperature amplified spontaneous emission at 1300 nm in solution-processed PbS quantum-dot elements. Opt. Lett. 30, 171 (2005).

[13] Fan, F. et al. Continuous-wave lasing in colloidal quantum dot solids enabled by facet-selective epitaxy. Nature 544, 75-79 (2017).
[14] Wu, K., Park, Y.-S., Lim, J. & Klimov, V. I. Towards zero-threshold optical gain using charged semiconductor quantum dots. Nat. Nanotechnol. 12, 1140-1147 (2017).
[15] Pradhan, S. et al. High-efficiency colloidal quantum dot infrared light-emitting diodes via engineering at the supra-nanocrystalline level. Nat. Nanotechnol. 14, 72-79 (2019).
[16] Xu, J. et al. 2D matrix engineering for homogeneous quantum dot coupling in photovoltaic solids. Nat. Nanotechnol. 13, 456-462 (2018).
[17] Bi, Y. et al. Infrared Solution-Processed Quantum Dot Solar Cells Reaching External Quantum Efficiency of 80% at 1.35 µm and J sc in Excess of 34 mA cm-2. Adv. Mater. 30, 1704928 (2018).
[18] Konstantatos, G. et al. Ultrasensitive solution-cast quantum dot photodetectors. Nature 442, 180-183 (2006).
[19] Goossens, S. et al. Broadband image sensor array based on graphene-CMOS integration. Nat. Photonics 11, 366-371 (2017).
[20] Hoogland, S. et al. A solution-processed 1.53 µm quantum dot laser with temperature-invariant emission wavelength. Opt. Express 14, 3273 (2006).
[21] Ning, Z. et al. Air-stable n-type colloidal quantum dot solids. Nat. Mater. 13, 822-828 (2014).
[22] Nishihara, T., Tahara, H., Okano, M., Ono, M. & Kanemitsu, Y. Fast Dissociation and Reduced Auger Recombination of Multiple Excitons in Closely Packed PbS Nanocrystal Thin Elements. J. Phys. Chem. Lett. 6, 1327-1332 (2015).
[23] Ono, M. et al. Impact of surface ligands on the photocurrent enhancement due to multiple exciton generation in close-packed nanocrystal thin elements. Chem. Sci. 5, 2696 (2014).
[24] Geiregat, P. et al. Continuous-wave infrared optical gain and amplified spontaneous emission at ultralow threshold by colloidal HgTe quantum dots. Nat. Mater. 17, 35-42 (2018).
[25] Salhi, A. et al. Enhanced modal gain of multilayer InAs/InGaAs/GaAs quantum dot lasers emitting at 1300 nm. J. Appl. Phys. 100, 123111 (2006).
[26] Kresse, G.; Furthmüller, J. Phys. Rev. B: Condens. Matter Mater. Phys. 1996, 54, 11169.
[27] Perdew, J. P.; Burke, K.; Ernzerhof, M. Phys. Rev. Lett. 1996, 77, 3865.
[28] Heyd, J.; Scuseria, G. E.; Ernzerhof, M. J. Chem. Phys. 2003, 118, 8207.
[29] Kresse, G.; Joubert, D. Phys. Rev. B: Condens. Matter Mater. Phys. 1999, 59, 1758.
[30] Monkhorst, H. J.; Pack, J. D.; Phys. Rev. B 1976, 13, 5188.
[31] Hummer, K.; Grüneis, A.; Kresse, G. Phys. Rev. B 2007, 75, 195211.
[32] Dornhaus, R.; Nimtz, G.; Schlicht, B. Narrow-Gap Semiconductors (Springer-Verlag, Berlin, 1985).
[33] Mashai Ono et al. Chem. Sci., 2014, 5, 2696.

The invention claimed is:

1. A method for obtaining an n-type doped metal chalcogenide quantum dot solid-state element with optical gain for low-threshold, band-edge amplified spontaneous emission (ASE), wherein said low-threshold refers to a number of excitons per quantum dot lower than the one expected from the excited state degeneracy of the respective quantum dot when undoped, the method comprising:

forming a metal chalcogenide quantum dot solid-state element, and
carrying out an n-doping process on at least a plurality of the metal chalcogenide quantum dots of said metal chalcogenide quantum dot solid-state element, to at least partially bleach its band-edge absorption, wherein said n-doping process comprises:
a partial substitution of chalcogen atoms by halogen atoms, in at least said plurality of metal chalcogenide quantum dots, and/or
a partial aliovalent-cation substitution of bivalent metal cations by trivalent cations, in at least said plurality of metal chalcogenide quantum dots; and
providing a substance on at least said plurality of metal chalcogenide quantum dots, wherein said substance is an oxide-type substance made and arranged to avoid oxygen p-doping of the plurality of metal chalcogenide quantum dots.

2. The method according to claim 1, wherein said metal chalcogenide is at least one of Pb-, Cd-, and Hg-chalcogenide, wherein said chalcogen atoms are at least one of sulphur, selenium, and tellurium atoms, and wherein said halogen atoms are at least one of iodine, bromine, and chlorine atoms.

3. The method according to claim 1, wherein said metal chalcogenide is at least one of Pb-, Cd-, and Hg-chalcogenide, wherein said bivalent metal cations are at least one of Pb, Cd, and Hg, in the +2 oxidation state, and wherein said trivalent cations are at least one of In, Bi, Sb, and Ga, in the +3 oxidation state.

4. The method according to claim 1, comprising providing said substance to:
coat said metal chalcogenide quantum dot solid-state element to isolate the same from ambient oxygen; and/or
infiltrate within the metal chalcogenide quantum dot solid-state element to react with oxygen present therein for suppressing their p-doping effect.

5. The method according to claim 1, wherein said substance is at least one of alumina, titania, ZnO, and hafnia.

6. The method according to claim 1, wherein said step of forming said metal chalcogenide quantum dot solid-state element comprises forming a blend with a host matrix of first metal chalcogenide quantum dots and, embedded therein, said plurality of metal chalcogenide quantum dots, which are second metal chalcogenide quantum dots having a smaller or equal bandgap, wherein said second metal chalcogenide quantum dots are larger than said first metal chalcogenide quantum dots, and wherein the method comprises applying said n-doping process at least on the second metal chalcogenide quantum dots so that they are heavily n-doped.

7. The method according to claim 1, comprising selecting the size of said plurality of metal chalcogenide quantum dots to obtain, after said n-doping process has been carried out thereon, an initial electron occupancy doping $<N>_D$ ranging from 1.4 to 5.4.

8. The method according to claim 7, wherein said step of selecting the size of said plurality of metal chalcogenide quantum dots comprises selecting quantum dot diameters ranging from 5.0 nm to 6.2 nm for PbS colloidal quantum dots.

9. The method according to claim 1, wherein at least part of said plurality of metal chalcogenide quantum dots are of a core-shell type, each including a core and at least one shell, wherein said core comprises a metal chalcogenide and said shell a distinct metal chalcogenide or an alloy of the metal chalcogenide of the core, and wherein the n-doping process is applied to either the core, the at least one shell, or both.

10. A method for obtaining a light emitter, comprising:
providing a gain medium comprising at least one n-type doped metal chalcogenide quantum dot solid-state element obtained according to the method of claim 1; and
providing an optical or electrical pump configured and arranged to excite said at least one n-type doped metal chalcogenide quantum dot solid-state element so that a population inversion is produced therein that generates an amplified spontaneous emission (ASE).

11. A light emitter, comprising:
a gain medium comprising at least one n-type doped metal chalcogenide quantum dot solid-state element obtained according to the method of claim 1; and
an optical or electrical pump configured and arranged to excite said at least one n-type doped metal chalcogenide quantum dot solid-state element so that a population inversion is produced therein that generates an amplified spontaneous emission (ASE).

12. A light emitter according to claim 11, wherein the light emitter is a superluminescence light emitter.

13. A light emitter according to claim 11, wherein the light emitter is a laser device further comprising a laser optical cavity and, optically coupled thereto, said gain medium, which is a laser gain medium, wherein said laser optical cavity is configured and arranged to provide optical feedback to said amplified spontaneous emission (ASE).

14. A light emitter according to claim 13, wherein said laser device comprises at least one of a vertical-cavity surface-emitting laser structure (VCSEL), a distributed feedback laser structure (DFB), and a whispering gallery mode laser structure (WGM).

15. A light emitter according to claim 14, wherein:
said VCSEL structure comprises said laser gain medium with a thickness ranging from 200 nm to 1 μm, sandwiched between two Bragg reflectors forming a photonic bandgap ranging from 1000 nm to 2000 nm;
said DFB structure comprises a waveguide resonator formed by:
a corrugated substrate with corrugations implemented by periodically arranged structured elements forming a grating with a grating height ranging from 20 nm to 500 nm, and a periodicity ranging from 700 nm to 1400 nm, and
said laser gain medium, with a thickness ranging from 20 nm to 1500 nm, arranged on top of said corrugated substrate over said corrugations;
and
said WGM structure comprises said laser gain medium with a thickness ranging from 10 nm to 2000 nm, optically coupled to one or more WGM resonators for single or multi laser mode, wherein the diameter of each resonator ranges from 50 μm to 1000 μm.

16. A light emitter according to claim 11, configured to emit light with a wavelength ranging from 800 nm to 2400 nm.

17. An n-type doped metal chalcogenide quantum dot solid-state element with optical gain for low-threshold, band-edge amplified spontaneous emission (ASE), wherein said low-threshold refers to a number of excitons per quantum dot lower than the one expected from the excited state degeneracy of the respective quantum dot when undoped, the n-type doped metal chalcogenide quantum dot solid-state element comprising a plurality of metal chalcogenide quantum dots with its band-edge absorption at least partially bleached, wherein said plurality of metal chalcogenide quantum dots comprises:
some chalcogen atoms substituted by halogen atoms, and/or
some bivalent metal cations aliovalent-cation substituted by trivalent cations;
and wherein a substance is provided on at least said plurality of metal chalcogenide quantum dots, wherein said substance is an oxide-type substance made and arranged to avoid oxygen p-doping of the plurality of metal chalcogenide quantum dots.

18. The n-type doped metal chalcogenide quantum dot solid-state element of claim 17, wherein said substance is at least one of alumina, titania, ZnO, and hafnia.

* * * * *